(12) United States Patent
Huang et al.

(10) Patent No.: US 11,758,255 B2
(45) Date of Patent: Sep. 12, 2023

(54) CAMERA MODULE AND MANUFACTURING METHOD THEREOF

(71) Applicant: NINGBO SUNNY OPOTECH CO., LTD., Ningbo (CN)

(72) Inventors: Zhen Huang, Ningbo (CN); Qimin Mei, Ningbo (CN); Bojie Zhao, Ningbo (CN); Zhewen Mei, Ningbo (CN); Li Liu, Ningbo (CN); Jiawei Chen, Ningbo (CN); Zongchun Yang, Ningbo (CN); Chenxiang Xu, Ningbo (CN)

(73) Assignee: NINGBO SUNNY OPOTECH CO., LTD., Zhejiang Province (CN)

( * ) Notice: Subject to any disclaimer, the term of this patent is extended or adjusted under 35 U.S.C. 154(b) by 0 days.

(21) Appl. No.: 17/750,743

(22) Filed: May 23, 2022

(65) Prior Publication Data
US 2022/0360694 A1    Nov. 10, 2022

Related U.S. Application Data

(63) Continuation of application No. 17/195,785, filed on Mar. 9, 2021, now Pat. No. 11,412,116, which is a
(Continued)

(30) Foreign Application Priority Data

Aug. 21, 2018 (CN) .......................... 201810952770.4
Aug. 21, 2018 (CN) .......................... 201821351551.2
(Continued)

(51) Int. Cl.
*H04N 23/55* (2023.01)
*B29C 43/18* (2006.01)
(Continued)

(52) U.S. Cl.
CPC ............. *H04N 23/55* (2023.01); *B29C 43/18* (2013.01); *H04N 23/54* (2023.01); *H04N 23/57* (2023.01);
(Continued)

(58) Field of Classification Search
CPC .................... G02B 7/021; G03B 17/02; G03B 2205/0069; G03B 2217/002; G03B 3/10;
(Continued)

(56) References Cited

U.S. PATENT DOCUMENTS 6,483,101 B1    11/2002 Webster
2009/0046183 A1    2/2009 Nishida et al.
(Continued)

*Primary Examiner* — Amy R Hsu
(74) *Attorney, Agent, or Firm* — Wenderoth, Lind & Ponack, L.L.P.

(57) ABSTRACT

A camera module includes an optical assembly, a filter and a molded photosensitive assembly mounted under the optical assembly and the filter, wherein the molded photosensitive assembly comprises a main body, a plurality of electronic components, a photosensitive chip, and a circuit board electrically connected with the electronic components and the photosensitive chip, wherein the electronic components, the photosensitive chip and the circuit board are positionally fixed with each other by the main body, wherein the photosensitive chip is fixed and surrounded by the bottom of the main body to keep distance with the filter, wherein the main body comprises a container body supporting the optical assembly thereon and a lower body supporting the filter thereon, wherein the lower body is extended from the inner side of the container body.

20 Claims, 17 Drawing Sheets

Related U.S. Application Data continuation of application No. 16/547,537, filed on Aug. 21, 2019, now Pat. No. 10,986,257.

(30) Foreign Application Priority Data

| May 24, 2019 | (CN) | ............... 201910438885.6 |
| May 24, 2019 | (CN) | ............... 201910438917.2 |
| May 24, 2019 | (CN) | ............... 201910439285.1 |
| May 24, 2019 | (CN) | ............... 201920764689.3 |
| May 24, 2019 | (CN) | ............... 201920765166.0 |
| May 24, 2019 | (CN) | ............... 201920766441.0 |

(51) Int. Cl.
*H04N 23/54* (2023.01)
*H04N 23/57* (2023.01)
*B29L 11/00* (2006.01)
*B29L 31/34* (2006.01)

(52) U.S. Cl.
CPC ........ *B29L 2011/00* (2013.01); *B29L 2031/34* (2013.01)

(58) Field of Classification Search
CPC .. H04N 5/2254; H04N 5/2257; H04N 5/2258; H04N 5/23212
See application file for complete search history.

(56) References Cited

U.S. PATENT DOCUMENTS

| 2017/0160402 | A1* | 6/2017 | Yoshioka | ............... G01T 1/17 |
| 2017/0229506 | A1 | 8/2017 | Iwafuchi et al. | |
| 2017/0244878 | A1* | 8/2017 | Wang | ............... G02B 7/021 |
| 2017/0307842 | A1* | 10/2017 | Nakamura | ............... H04N 23/54 |
| 2019/0089875 | A1 | 3/2019 | Fan | |
| 2019/0165019 | A1 | 5/2019 | Wang et al. | |
| 2019/0387157 | A1 | 12/2019 | Chen et al. | |
| 2020/0286933 | A1* | 9/2020 | Tanaka | ............... H04N 23/54 |
| 2020/0344413 | A1* | 10/2020 | Lasiter | ............... H04N 23/54 |

* cited by examiner

CAMERA MODULE AND MANUFACTURING METHOD THEREOF

CROSS REFERENCE OF RELATED APPLICATION

This application is a Continuation application that claims the benefit of priority under 35 U.S.C. § 120 to a non-provisional application, application Ser. No. 16/547,537, filed Aug. 21, 2019, which is a non-provisional application that claims the benefit of priority under 35 U.S.C. § 119 to Chinese application number 2018109527704, filed Aug. 21, 2018, Chinese application number 2018213515512, filed Aug. 21, 2018, Chinese application number 2019104389172, filed May 24, 2019, Chinese application number 2019207651660, filed May 24, 2019, Chinese application number 2019104392851, filed May 24, 2019, Chinese application number 2019207646893, filed May 24, 2019, Chinese application number 2019104388856, filed May 24, 2019, and Chinese application number 2019207664410, filed May 24, 2019, which are incorporated herewith by references in their entirety.

BACKGROUND OF THE PRESENT INVENTION

Field of Invention

The present invention relates to optical sensor, and more particularly to a camera module and manufacturing method thereof.

Description of the Related Arts

A highly qualified camera is necessary to be installed in a smart device these days. For example, a smart phone is sensing the world by at least one or two cameras for acquiring images. In pursing the thinner smart device, the smaller camera become more completive in marketing sales.

During the arranging processes of conventional camera module, a chip and a plurality of electronic elements are attached on a circuit board firstly, and a holder is formed on the circuit board by attaching or molding, and normally a filter assembly is attached on the holder. Then the optical lens is attached on the filter assembly to remain the optical lens on the light sensitive passage of the chip.

The thickness of the camera module mainly decided by the thickness of the circuit broad, the height of the holder, the thickness of the filter assembly and the height of the optical lens, in this arranging processes. In other words, with the conventional design structure, the height of the camera module is equally same as the sum of the thickness of the circuit broad, the height of the holder, the thickness of the filter assembly and the height of the optical lens, which is highly limitation of development of smaller camera module.

There is an avoiding space remained between the holder and the electronic elements in the conventional camera module. And the filter assembly is mounted on the arms of the holder. The arms mounted with the filter assembly has a minimum thickness, above 0.2 mm. Furthermore, a safety distance between the top surface of the filter assembly and the bottom surface of the optical lens is remained, so that the stacking accumulation in height in conventional camera module causes the difficulty to reduce the height of the holder.

A conventional camera module in a smart phone is disclosed in FIG. 1. A filter assembly 20P is supported by a sensor assembly 30P thereon. And an optical assembly 10P is mounted on the top of the filter assembly 20P for transmitting shaped and filtered light into a sensor 300P of the sensor assembly 30P. For better quality, the filter assembly 20P is required to be placed between the optical assembly 10P and the sensor 300P. So the thickness of the conventional camera module is decided from the sensor assembly 30P to the optical assembly 10P. And the size of the conventional camera module is hardly to be reduced since there is the height of the optical assembly 10P, the thickness of the filter assembly 20P and the height of the sensor assembly 30P. The conventional camera module with such a size is not suitable and not beautiful for a thin and fashion smart phone. In this embodiment of the conventional camera module, the filter assembly 20P comprises a filter element 21P and a filter supporter 22P surrounded and supported the filter element 21P between the optical assembly 10P and the sensor assembly 30P. The height of the optical assembly 10P and the thickness of the sensor assembly 30P are really hard to reduce because of the complicated optical design of the optical assembly 10P and the size of the electronic components inside the sensor assembly 30P. Especially, the rear focal distance of the camera module is requited to be less than 0.6 mm, which is impossible to achieve with conventional process.

Some kinds of the conventional camera module are trying to mount the filter element 21P under the optical assembly 10P directly without the filter supporter 22P to reduce the thickness of the camera module, but the optical assembly 10P is stressed on the filter element 21P directly and the filter element 21P can hardly bare the weight or the movement of the optical assembly 10P when activated in using. Also the glue of mounting the optical assembly 10P is easy to flow into the center of the filter element 21P to cover the transmitting area thereof. These kinds of broken filter elements 21P will cause the whole camera module too difficult to acquire images.

Other kinds of the conventional camera module are trying to attach the filter element 21P on the surface of the sensor 300P or the bottom surface of the lenses of the optical assembly 10P. But it requires more details to attach the filter element 21P on the surface to be like a film on a glass. For example, the flatness between the filter element 21P and the sensor 300P is very hard to ensure and both of the durability of the filter element 21P and the sensor 300P will be adversely effected. Once there is bubbles or wrinkles, the filtering effect of the filter element 21P is reduced and may fail to work so that the quality and reliability of the camera module are reduced.

In fact, the distances between the optical assembly 10P and the filter element 21P and between the filter element 21P and the sensor 300P are essential for the quality of imaging. After reflected by the filter element 21P, stray light goes into the sensor 300P. If the distance between the filter element 21P and the sensor 300P is too short, stray light goes into the center of the sensor 300P which is the sensing area for imaging. If the distance between the filter element 21P and the sensor 300P is a little further, stray light goes into the periphery of the sensor 300P which is easy to be ignored during calculating. So maybe attaching the filter element 21P on the surface of the sensor 300P or the bottom surface of the lenses of the optical assembly 10P can reduce the thickness of the camera module, but the validity of acquiring images has to be reduced, which means the filter element 21P did not achieve the best effect, which is not good enough for smart devices.

SUMMARY OF THE PRESENT INVENTION

The invention is advantageous in that it provides a camera module and manufacturing method thereof, wherein the thickness of the camera module is mainly depended on the height of an optical lens and the thickness of a molded photosensitive assembly to save installation space in a smart device.

Another advantage of the invention is to provide a camera module and manufacturing method thereof, wherein the difficulty and complexity of manufacturing the optical lens and the molded photosensitive assembly are not increased for efficiently producing the small-sized camera module.

Another advantage of the invention is to provide a camera module and manufacturing method thereof, wherein the filter is well supported and has no needs to support the optical lens, so that the optical lens is supported stably without considering about damaging the filter.

Another advantage of the invention is to provide a camera module and manufacturing method thereof, wherein a lens glue adhered between the optical lens and the molded photosensitive assembly is away from the filter to keep the transmitting area of the filter to be uncovered.

Another advantage of the invention is to provide a camera module and manufacturing method thereof, wherein the distance between the filter and the optical lens is ensured to have less stray light into a photosensitive chip molded in the molded photosensitive assembly in order to enhance imaging quality.

Another advantage of the invention is to provide a camera module and manufacturing method thereof, wherein the distance between the filter and the photosensitive chip is ensured to have less stray light into the center of the photosensitive chip in order to increase imaging quality.

Another advantage of the invention is to provide a camera module and manufacturing method thereof, wherein the photosensitive chip can hardly be stressed by the filter and be capable of having better sensing ability.

Another advantage of the invention is to provide a camera module and manufacturing method thereof, wherein the optical lens is directly supported by the molded photosensitive assembly so that the optical lens has a strong support.

Another advantage of the invention is to provide a camera module and manufacturing method thereof, wherein the molded photosensitive assembly provide a higher support for the optical lens and a lower support for the filter so that the optical lens and the filter are stably supported while the interfere between the optical lens and the filter is avoided effectively.

Another advantage of the invention is to provide a camera module and manufacturing method thereof, wherein the optical lens is capable of mounting on the molded photosensitive assembly to fit the peripheral shape of the smart device so that the imaging ability is ensured with better looking appearance.

Additional advantages and features of the invention will become apparent from the description which follows, and may be realized by means of the instrumentalities and combinations particular point out in the appended claims.

According to the present invention, the foregoing and other objects and advantages are attained by a camera module comprising:

an optical lens;

a filter; and a molded photosensitive assembly adhered with the optical lens and the filter, wherein the molded photosensitive assembly comprises a main body, a plurality of electronic components, a photosensitive chip, and a circuit board connected with the electronic components and the photosensitive chip, wherein the electronic components, the photosensitive chip and the circuit board are positionally fixed with each other surrounded by the main body, wherein the main body comprises a container body supporting the optical lens thereon and a lower body supporting the filter thereon, wherein the photosensitive chip is surrounded by a bottom of the main body to keep a distance away from the filter.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The present invention provides a camera module, as shown in FIG. 2 to FIG. 21, which is small sized and adapted to be installed in a smart device for acquitting images. The first embodiments of the present invention of the camera module is illustrated in FIGS. 2-11, which comprises an optical assembly 10, a filter 20 and a molded photosensitive assembly 30. The thickness of the camera module is decided by the height of the optical assembly 10 and the thickness of the molded photosensitive assembly 30. The molded photosensitive assembly 30 is capable of receiving imaging lights transmitted from the optical assembly 10 to the filter 20. After the imaging lights are shaped by the optical assembly 10 and filtered by the filter 20, a photosensitive chip 33 molded in the molded photosensitive assembly 30 has high quality resource to image. The optical assembly 10 can be implemented as optical lens, motor lens, etc.

Figure 1:
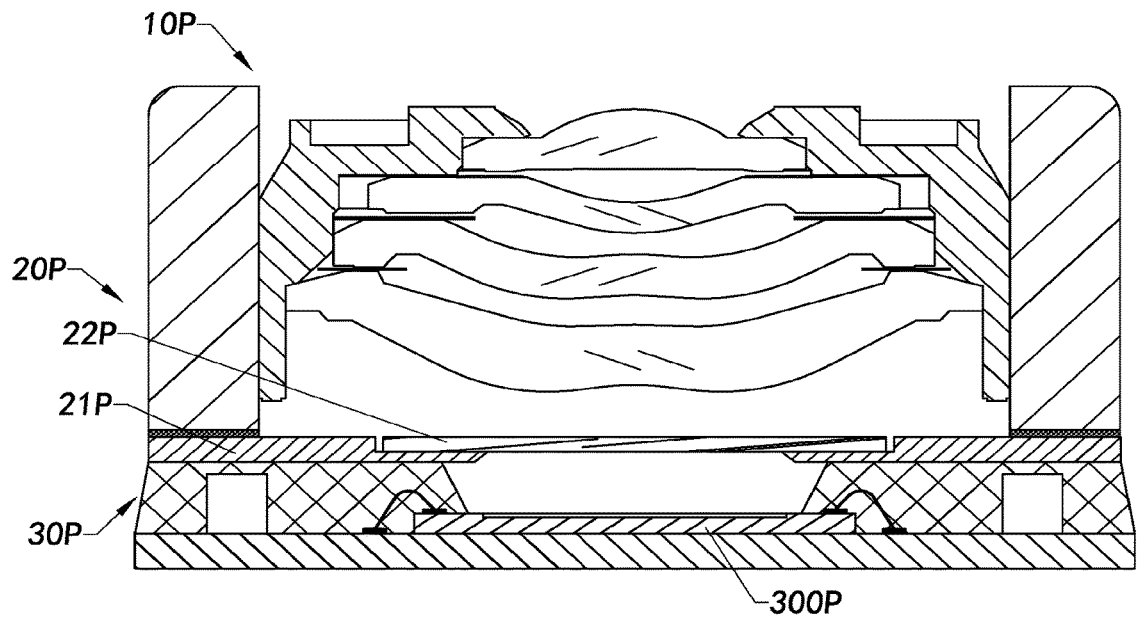
FIG. 1 is a sectional view of a conventional camera module in a smart device.
Figure 2:
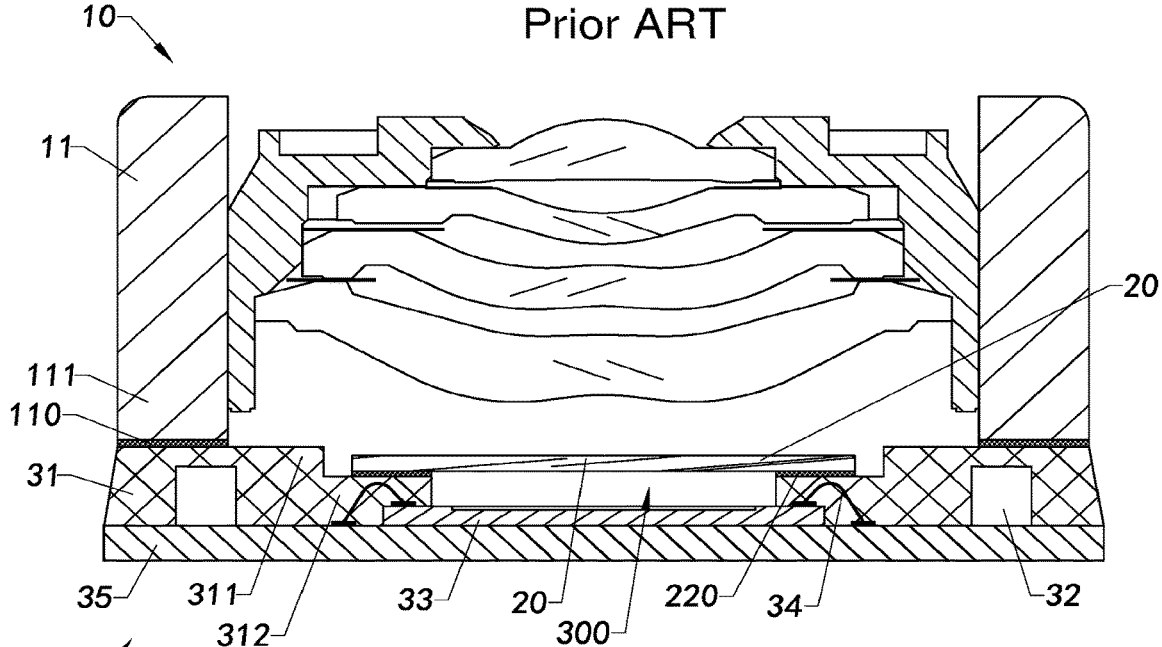
FIG. 2 is a sectional view of a camera module according to a first preferred embodiment of the present invention.
Figure 3:
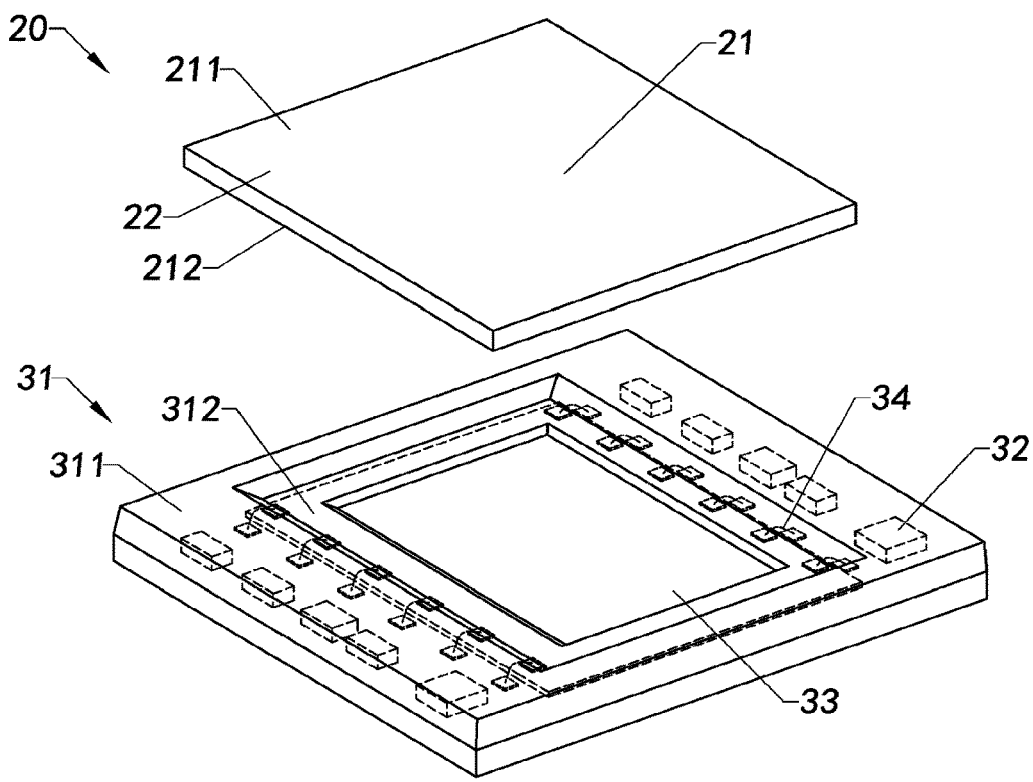
FIG. 3 is a perspective view of the filter and the molded photosensitive assembly of the camera module according to the above preferred embodiment of the present invention.
Figure 4:
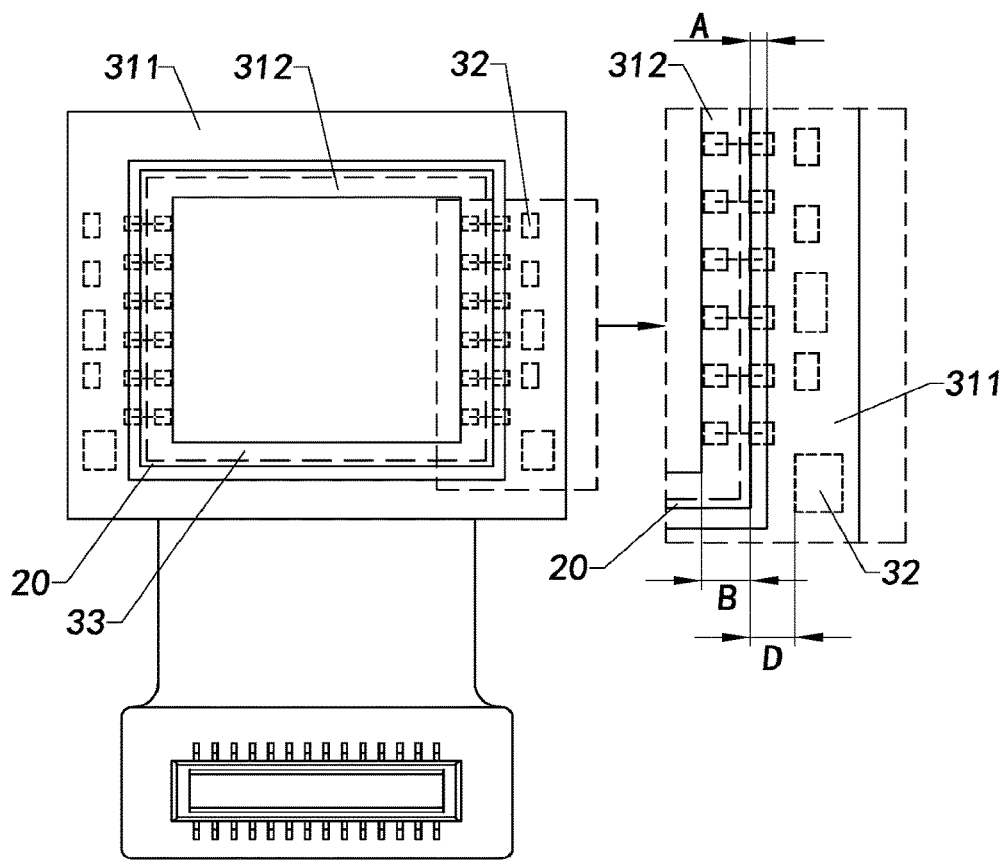
FIG. 4 is a top view of the filter and the molded photosensitive assembly of the camera module according to the above preferred embodiment of the present invention.

The filter 20 is mounted on the molded photosensitive assembly 30 at a lower place than where the optical assembly 10 is mounted on the molded photosensitive assembly 30, as shown in FIGS. 2-4, so that the distances between the filter 20 and the molded photosensitive assembly 30 and between the filter 20 and the optical assembly 10 are maintained to have less stray lights transmitted into the center of the molded photosensitive assembly 30. In this embodiments, the filter 20 is fixed on the molded photosensitive assembly 30 with a filter glue 220. And the optical assembly 10 is fixed on the molded photosensitive assembly 30 with a lens glue 110. It is worth to mention that the filter glue 220 and the lens glue 110 are at different levels on the molded photosensitive assembly 30 so that the lens glue 110 is kept a distance away from the filter glue 220 to have no chance to cover the filter 20.

Furthermore, in the embodiment, the photosensitive chip 33 is preferably fixed at the bottom of the molded photosensitive assembly 30. The optical assembly 10 is adhered on the top of the molded photosensitive assembly 30. And with the filter 20 is adhered between the optical assembly 10 and the photosensitive chip 33, the molded photosensitive assembly 30 is supporting the optical assembly 10 and the filter 20 with stable supporting force.

The optical assembly 10 comprises a lens-barrel 11 and a plurality of lenses 12 mounted therein. And the lens-barrel 11 comprises a leg 111 supported the lenses 12 away from the filter 20. The leg 111 of the lens barrel 11 is fixed on the molded photosensitive assembly 30 to support the lenses 12 in distance from the filter 20 and the photosensitive chip 33 to have imaging lights transmitted in required quality.

The filter 20 comprises a filtering portion 21 transmitted imaging light and a peripheral portion 22 extended from the filtering portion 21 and supported on the molded photosensitive assembly 30 so as to align the filtering portion 21 with the photosensitive chip 33. It is worth to mention that the filter glue 220 is between the peripheral portion 22 and the photosensitive assembly 30 which is not covering the filtering portion 21 and the photosensitive chip 33 of the molded photosensitive assembly 30. And the peripheral portion 22 of the filter 20 is directly supported on the molded photosensitive assembly 30 without any external supporting device. Especially, in one embodiment of the present invention, the peripheral portion 22 is integrally extended from the filtering portion 21, and the peripheral portion 22 is positioned to surround the filtering portion 21, so that the filter 20 is a one-piece element for easily being fixed in the supporting cavity 300 of the molded photosensitive assembly 30.

Especially, the molded photosensitive assembly 30 further comprises a main body 31, a plurality of electronic components 32 and a circuit board 35. The photosensitive chip 33 is electrically connected with the electronic components 32 through the circuit board 35. The main body 31 is embedding the electronic components 32 on the circuit board and forms the supporting cavity 300 to hold the filter 20 and the optical assembly 10 with a distance therebetween. In other words, the main body 31 covers part of the electronic components 32 and the circuit board 35, wherein the photosensitive chip 33 is surrounded by the bottom of the main body 31 and kept a distance with the filter 20.

In this embodiment, the photosensitive chip 33 is connected to the circuit board 35 with a set of wires 34. One end of the wire 34 is fixed on the circuit board 35, while the other end of the wire 34 is fixed on the photosensitive chip 33. One skilled in the art will understand that the photosensitive chip 33 is transferred light into images with connected electronic components 32 on the circuit board 35. The main body 31 is partly covered on the photosensitive chip 33 to fixed photosensitive chip 33 and the wires 34 on the circuit board 35 inside the main body 31. In other words, the wires 34 and the periphery of the photosensitive chip 33 are fully covered inside the main body 31 of the molded photosensitive assembly 30 to be protected. And the photosensitive chip 33 is surrounded with the electronic components 32, as shown in FIGS. 2-5, and the periphery of the main body 31 embedded with the electronic components 32 is higher than the inner portion of the main body 31 which is embedded with the wires 34.

Furthermore, the top of the periphery of the main body 31 is supporting the optical assembly 10 which is away from the filter 20 and the photosensitive chip 33 so that the filter 20 and photosensitive chip 33 are not under the stress of the optical assembly 10. Preferably, not only the places of the electronic components 32, the photosensitive chip 33 and the filter 20 are settled by the main body 31, the size of the main body 10 and the distance between the main body 10 and the filter 20 are designed accordingly for enhancing compactness, stability and reliably of the camera module and the detail numbers are disclosed in the following paragraphs. It is worth to mention that the drawings only illustrate positional relationships of the optical assembly 10, the filter 20 and the molded photosensitive assembly 30 without exact size proportion.

Figure 5:
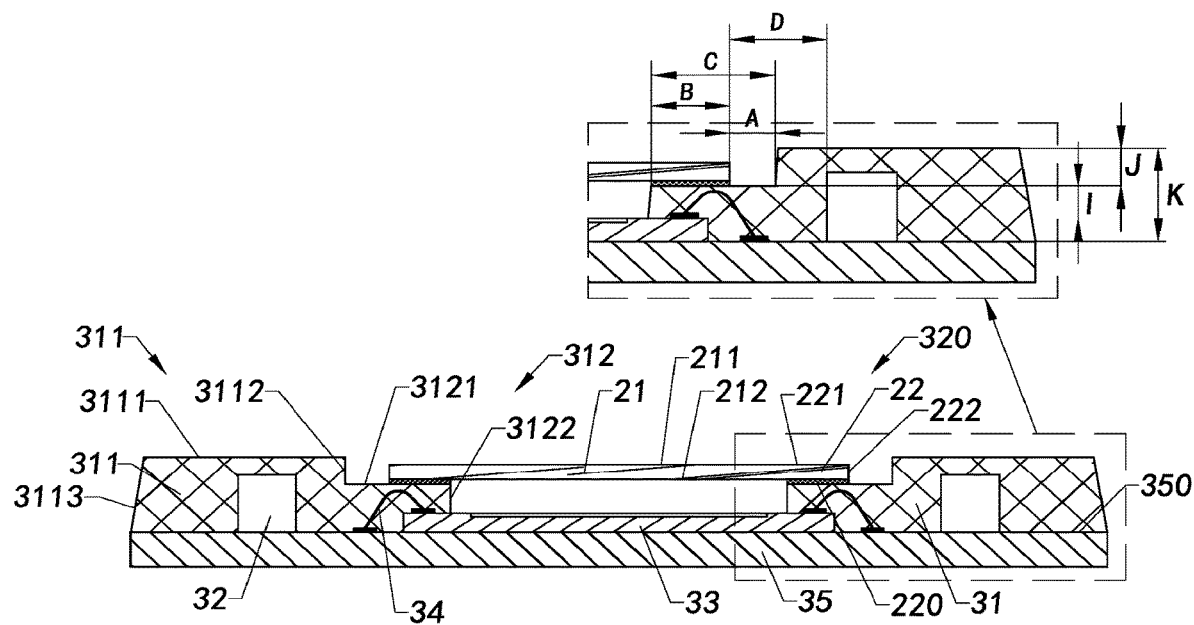
FIG. 5 is a sectional view of the filter and the molded photosensitive assembly of the camera module according to the above preferred embodiment of the present invention.

Furthermore, as shown in FIGS. 4-5, the filtering portion 21 has an in-light surface 211 and an out-light surface 212, wherein the in-light surface 211 is facing to the lenses 12 of the optical assembly 10 and the out-light surface 212 is facing to the photosensitive chip 33. After the imaging light is shaped by the lenses 12 of the optical assembly 10, the imaging light is passing through the in-light surface 211 firstly and the out-light surface 212 secondly so as to be filtered. Preferably, the filtering portion 21 is made of infrared-ray filtered material. The peripheral portion 22 has a peripheral top surface 221, a peripheral side surface 222 and a peripheral bottom surface 223. In this embodiment, the peripheral top surface 221 is a same surface with the in-light surface 211 and the peripheral bottom surface 223 is a same surface with the out light surface 222.

It is worth to mention that the peripheral bottom surface 223 of the peripheral portion 22 of the filter 20 is adhered by the filter glue 220 to the main body 31 of the molded photosensitive assembly 30, so that the filtering portion 21 is clear to be transmitted the imaging light. And the filtering portion 21 and the peripheral portion 22 have no needs to support anything on the in-light surface 211 or the peripheral top surface 221, which provides more reliability for the filter 20.

Particularly, the main body 31 of the molded photosensitive assembly 30 comprises a container body 311 and a lower body 312 integrally extended from inner side of the container body 311. Both of the container body 311 and the lower body 312 are formed and molded on a connecting surface 350 of the circuit board 35 to cover the electronic components 32, the wires 34 and the photosensitive chip 33. In the first embodiment, the electronic components 32 are mainly embedded inside the container body 311, and the wires 34 and the photosensitive chip 33 are mainly embedded inside the lower body 312. In other embodiments, the electronic components 32 can be embedded under the lower body 312.

Especially, the container body 311 has a certain distance in highest with the lower body 312 to form a square slot inside the main body 31, so that the filter 20 is provided inside the square slot of the main body 31. In other words, the container body 311 has a higher top surface 3111 and a higher side surface 3112, wherein the higher top surface 3111 of the container body 311 is supporting the optical assembly 10 thereon. The lower body 312 has a lower top surface 3121 and a lower side surface 3122, wherein lower top surface 3121 of the lower body 312 is supporting the filter 20 thereon, wherein the higher side surface 3112 of the container body 311 and the lower side surface 3122 of the lower body 312 forms the supporting cavity 300 of the molded photosensitive assembly 30 inwardly. The distance between the higher top surface 3111 of the container body 311 and the connecting surface 350 of the circuit board 35 is larger than the distance between the lower top surface 3121 of the lower body 312 and the connecting surface 350 of the circuit board 35. In other words, the higher side surface 3112 and the lower top surface 3121 are shaped groovedly to receive the filter 20 therein without protruding the filter 20 above the higher top surface 3111. It is appreciated that the container body 311 has a higher outer surface 3113, so as to form the outer surrounding surface of the main body 31.

In this embodiment, as shown in FIG. 5, the height J between the container body 311 and the lower body 312 is larger than 0.1 mm. In other words, the distance between the higher top surface 3111 and the lower top surface 3121 is greater than 0.1 mm to fit the thickness of the filter 20 and the filter glue 220. Preferably, the height J between the container body 311 and the lower body 312 is greater or equal to the sum of the thickness of the filter 20, the filter 220 and wealth of 0.04 mm (such as 0.28 mm), so that the thickness of the filter 20 is hidden inside the main body 31 of the molded photosensitive assembly 30.

And the thickness H of the filter glue 220, which has to be considered, is less than 0.03 mm. The thickness of the filter glue 220 is adapted to be reduced with the adhesion strong enough while using a thermosetting glue in this embodiment.

It is worth to mention that the length C of lower top surface 3121 of the lower body 312, which is from the higher side surface 3112 to lower side surface 3122, or can be named as the thickness of the lower body 312, is equal or greater than 0.4 mm, so that with ensuring the container body 311 and the lower body 312 can be L-shaped slotedly, the length C ensures enough mounting area on the lower top surface 3121 of the lower body 312 for the filter 20, which is adapted to allow deviation of mounting the filter 20 to avoid adverse affect. There is enough area on the lower top surface 3121 for the filter glue 220 to draw, which increases the contact area of the filter 20 and the filter glue 220 to improve adhesion of glue.

The filter glue 220 is applied between the peripheral bottom surface 223 of the peripheral portion 22 of the filter 20 and the lower top surface 3121 of the lower body 312 to connect the peripheral portion 22 of the filter 20 with the lower body 312 via the filter glue 220. The filter glue 220 is applied in an approximate square shape which is smaller than an approximate square shape of the lens glue 110.

Preferably, the width of the filter glue 220, between the peripheral bottom surface 223 and the lower top surface 3121 of the lower body 312, has maximum which equally to the width B of the peripheral portion 22 which is equal or greater than 0.25 mm, so that the filter 20 is stably supported on the peripheral portion 22 to ensure enough mounting area on the lower top surface 3121 of the lower body 312 for the filter 20, which is adapted to allow deviation of mounting the filter 20 to avoid adverse effect with the filtering portion 21 aligned to the photosensitive chip 33.

Furthermore, there is a gap between the side of the filter 20 to the inner side of the container body 311 of the main body 31. In other words, the filter 20 is not touching the main body 31 to reduce vibration transferred by the main body 31 from the optical assembly 10. Also the lens glue 110 is away from the in-light surface 211 of the filtering portion 21 because of the gap between the side of the filter 20 to the inner side of container body 311 of the main body 31 can receive the extra lens glue 110 inside, which can effectively prevent the lens glue 110 from flowing on in-light surface 211 of the filtering portion 21. Preferably, the distance A between the peripheral side surface 222 of the peripheral portion 22 of the filter 20 and the higher side surface 3112 of the container body 311 is equal or greater than 0.15 mm, which is beneficial to be aside between the filter 20 and the container body 311, like leaving a space.

It is worth to mention that the lens glue 110 is connected the leg 111 of the lens-barrel 11 and the higher top surface 3111 of the container body 311 of the main body 31 to support the optical assembly 10 mainly on the container body 311 to reduce stress on the photosensitive chip 33. Preferably, the height K of the container body 311 is equal or greater than 0.5 mm, so that the container body 311 covering the electronic components 32 can be effectively molded, and also the electronic components 32 can be protected from being over stressed by the leg 111 of the optical assembly 10. And since the filter 20 is supported on the lower body 312, the filter 20 has no needs to afford the weight and movement of the optical assembly 10 to enhance reliability. Especially, the lens-barrel 11 is directly on the main body 31, so that the thickness of the camera module is decided by the height of the optical assembly 10 and the thickness of the molded photosensitive assembly 30 to reduce the thickness of the whole camera module.

It is worth to mention that, the capacitors of the electronic components 32 normally have biggest size. Therefore, the distance D between the capacitor of the electronic components 32 and the peripheral side surface 222 of the peripheral portion 22 of the filter 20 is preferably equal or greater than 0.2 mm, for avoiding the interference between the manufacturing mold and the electronic components 32 and having enough space to optimize structure between the electronic components 32 and the filter 20, which benefits forming complicate mold structure therebetween to increase function of mold structure. Preferably, the distance D between each of the electronic components 32 and the peripheral side surface 222 of the peripheral portion 22 of the filter 20 is equal or greater than 0.25 mm.

According to the embodiment, the container body 311 and the lower body 312 are also shaped as an approximated square with rounded corners which the inradius F of the inscribed circle of the rounded corners are is equal or greater than 0.3 mm. It is worth to mention that the rounded corners of the container body 311 and the lower body 312 needs to be aside with the filter 20, like leaving a space, to reduce opportunities of interference between the rounded corners of the container body 311 and the lower body 312. Of course, in other embodiments of the present invention, the rounded corners of the container body 311 and the lower body 312 can be designed as the rounded corners of the filter 20.

With the photosensitive chip 33 fixed at the bottom of the lower body 312 of the main body 31, the filter 20 is kept distance with the photosensitive chip 33 by the lower body 312. Preferably, the distance I between the lower top surface 3121 of the lower body 312 and the photosensitive chip 33 is preferred to be equal or greater than 0.15 mm, which ensures the mold structure is thick enough to block stray light reflected from the optical lens, the filter and other structure to reduce useless light and improve the quality of imaging, also can avoid the photosensitive chip 33 from being stressed or broken. Meanwhile, the distance I is equal or greater than 0.15 mm to avoid interference between the manufacturing mold and the wires 34 and prevent exposing the wires 34. It is appreciated that if the rear focal length meets requirement, the distance I can be as large as possible to avoid black point formed by the dirt of the filter 20. Especially, if the distance I between the lower top surface 3121 of the lower body 312 and the photosensitive chip 33 is larger than 0.25 mm. And the capacitor can be placed under the lower body 312 to reduce the size in XY direction of the camera module.

Thus, in this embodiment, the main body 31 is not only covering the electronic components 32 and the wires 34 to protect, but also provide the supporting cavity 300 to hold the optical assembly 10 and the filter 20 respectively without over stressed on the electronic components 32 or the photosensitive chip 33.

It is worth to mention that, on the one hand, in order to improve screen ratio of mobile phone (e.g. smart phone), the fitness between the side surface of the camera module and the side surface of the smart phone is more and more highly required, that is user want the camera module close to the casing of the smart phone. On the other hand, in other to have good touching and holding feelings, the casing of the smart phone has an arc-shaped curve (e.g. curved frame). The side walls of the module of the camera module are generally flush, which causes the flush sidewalls of the camera module to not fit well with the curved outer frame of the smart phone, so that there is a large gap between them, which greatly limits the fitness of the camera module to the smart phone. It can be understood that although the camera module of the present invention can reduce the height of the camera module by reducing the height of the container body 311, it is limited by the height of the electronic component 32 itself. The degree of reduction of the height of the container 311 is limited. Therefore, the fitness between the camera module and the smart phone of the above embodiment of the present invention is still not good enough.

Figure 6:
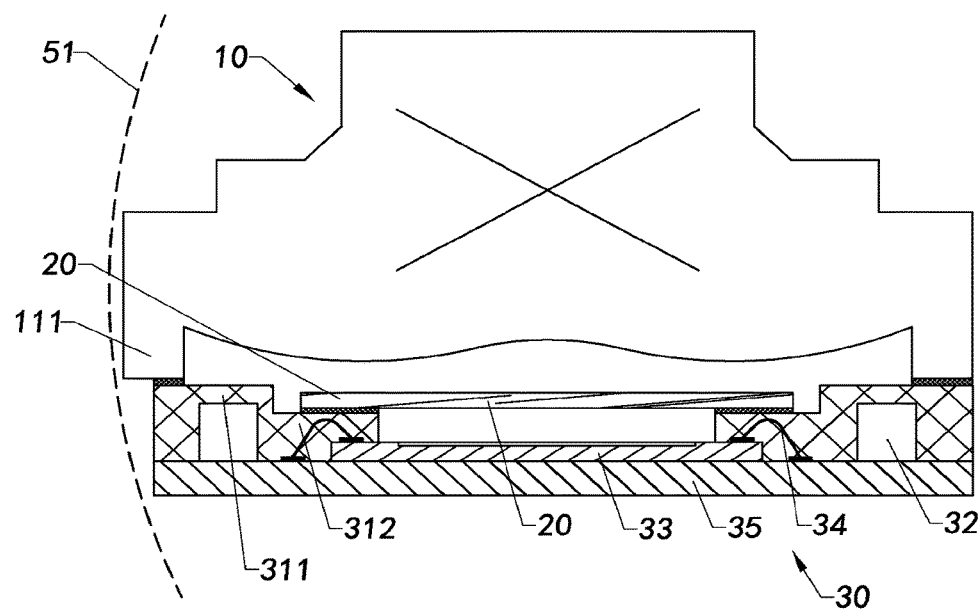
FIG. 6 is a sectional view of the camera module according to the above preferred embodiment of the present invention, illustrating an alternative installing mode in a smart phone.

In order to solve above mentioned problems, as shown in FIG. 6, the present invention further provides a modified embodiment of the camera module according to the above embodiment of the present invention, wherein the optical assembly 10 of the camera module is eccentrically disposed on the molded photosensitive assembly 30, to enable the optical assembly 10 to be further adjacent to a mounting casing 51. That is, when the camera module is fixed to the mounting casing 51, the optical assembly 10 can be biased toward the mounting casing 51 by an eccentric arrangement, so that the optical assembly 10 can be further close to the mounting casing. 51, which helps to further improve the degree of fitness between the camera module and the mounting casing 51.

In other words, the optical assembly 10 can be slightly bias placed with the molded photosensitive assembly 30 to adapt the mounting casing 51 of the smart phone. And the optical assembly 10 is capable of being slightly non-aligned with the molded photosensitive assembly 30 to fit the case of the smart device, as shown in FIG. 6. In other words, the leg 111 of the lens-barrel 11 is slightly protruded from the higher top surface 3111 of the container body 311, which has no effect on the stability of the filter 20.

It is worth to mention that when the camera module is mounted on the top side of the mounting casing 51 of the smart device, the leg 111 of the lens-barrel 11 only needs to have a side slightly protruding from the higher top surface 3111 of the container body 311. And when the camera module is mounted on a corner of the mounting casing 51 of the smart device, the legs 111 of the lens-barrel 11 need to have adjacent sides protruded outwardly from the top surface 3111 of the container body 311, so that the camera module is in contact with the corner of the mounting casing 51 of the device.

Figure 7A:
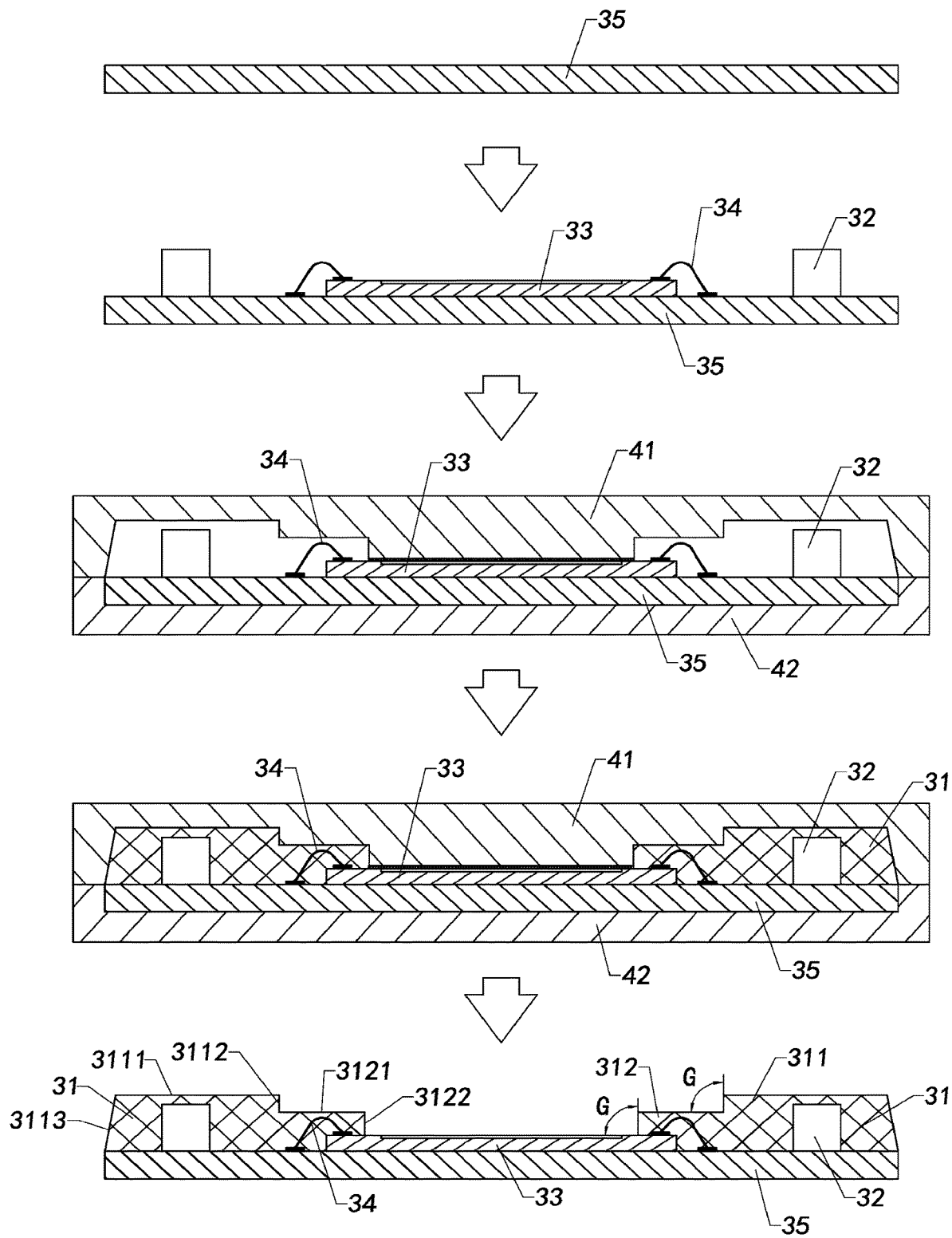
FIGS. 7A and 7B are flow diagrams of a manufacturing method of the camera module according to the above preferred embodiment of the present invention.
Figure 7B:
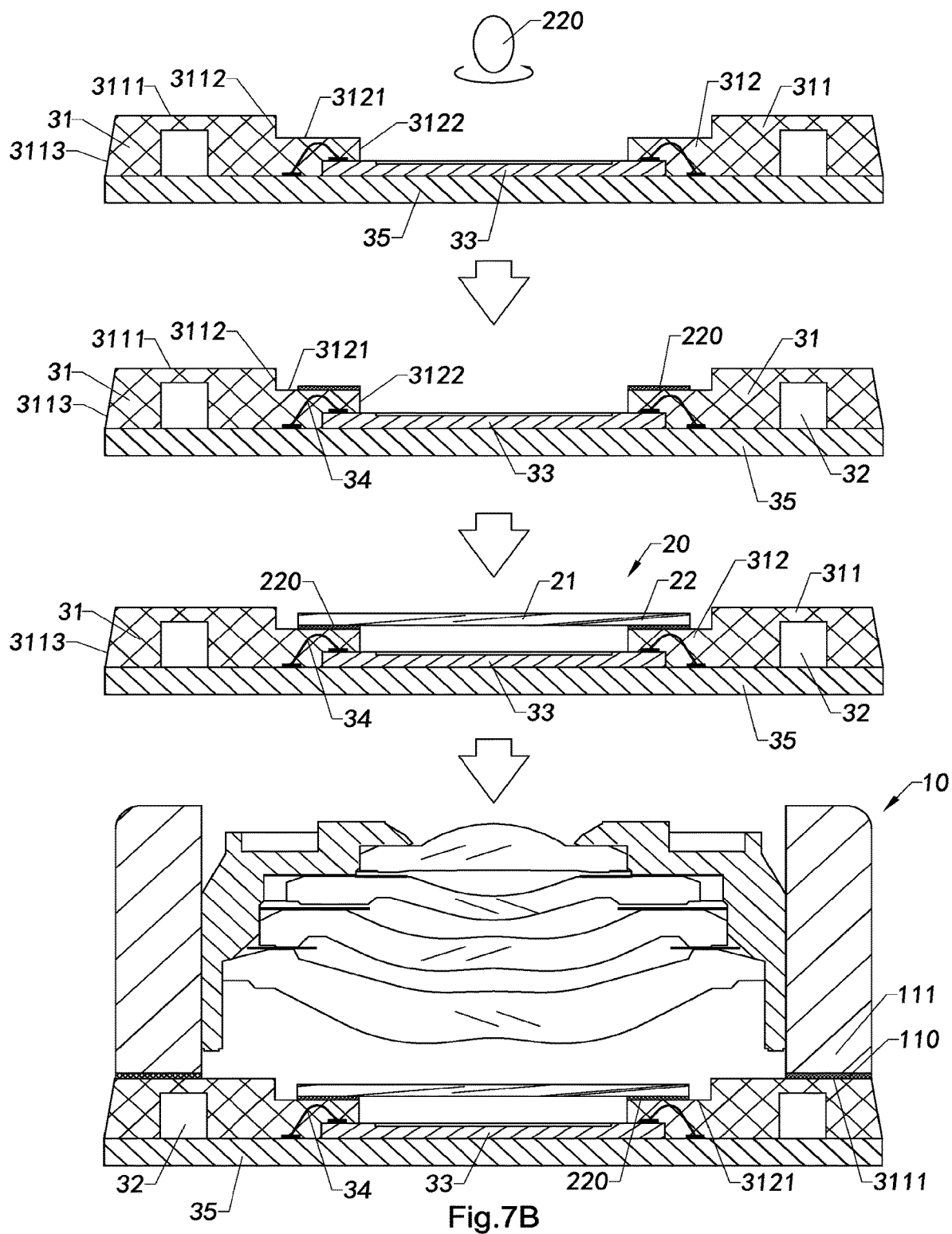
Figure 8:
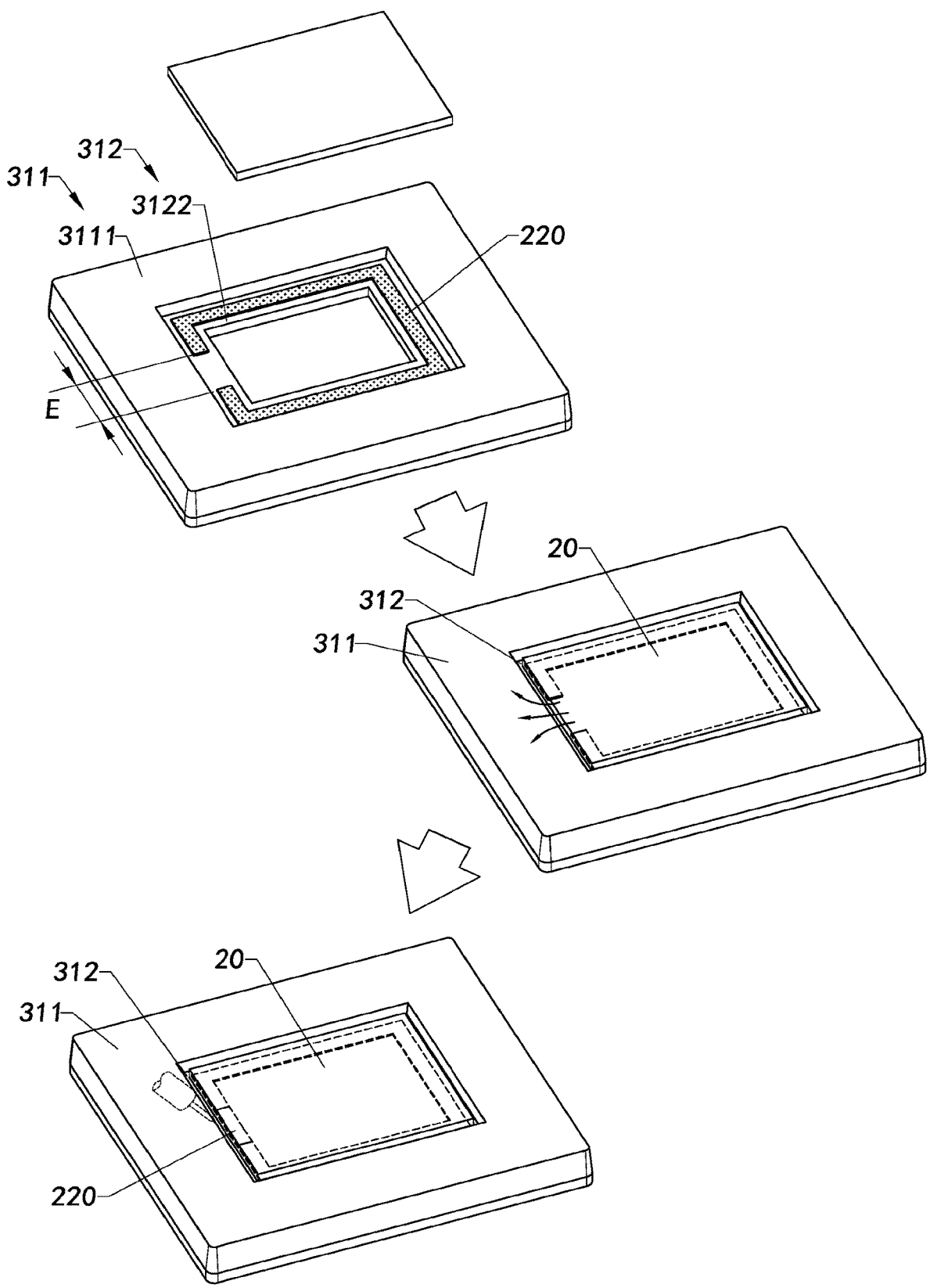
FIG. 8 is a flow diagram of a manufacturing method of the camera module according to the above preferred embodiment of the present invention.

A manufacturing method of the camera module is illustrated in FIGS. 7A-8. The method, as shown in FIG. 7A, comprises steps of:

I. connecting the photosensitive chip 33 with the wires 34 and the electronic components 32 on the circuit board 35;

II. placing the connected circuit board 35 between an upper mould 41 and a lower mould 42; and III. embedding the electronic components 32 on the circuit board 35 by the main body 31 which comprises the container body 311 and the lower body 312 to form the molded photosensitive assembly 30.

Furthermore, as shown in FIG. 7B, the method further comprises steps of:

IV. mounting the filter 20 on the lower top surface 3121 of the lower body 312; and V. mounting the optical assembly 10 on the higher top surface 3111 of the container body 311.

Furthermore, in the step III, the lower top surface of the lower body is lower the higher top surface of the container body, and the lower top surface of the lower body is lower than the highest component of the electronic components 32.

In one embodiment, the electronic components 32, the wires 34 and the periphery of the photosensitive chip 33 is embedded in the main body 31.

Illustratively, as shown in FIG. 19A, the step III further comprises the steps of:

III.1. injecting molding material between the upper mould 41 and the lower mould 42;

III.2. solidifying molding material to form the main body 31; and

III.3. demolding the upper mould 41 and the lower mould 42 from the molded photosensitive assembly 30.

It is worth to mention that, as shown in FIG. 19A, the angle G between the higher side surface 3112 of the container body 311 and the lower top surface 3121 of the lower body 312 is preferably equal to or greater than 95, for easily drafting operation. More preferably, the angle G between the higher side surface 3112 and the lower top surface 3121 is also less than 100° so as to be able to block certain stray light while ensuring smooth molding of the molded structure. Furthermore, in order to ensure normal molding processing, the fillet radius between the higher side surface 3112 and the lower top surface 3121 is substantially equal to 0.1 mm. In other words, since the angle between the higher side surface 3112 of the container body 311 and the normal line of the lower top surface 3121 can be referred to as the draft angle of the higher side surface 3112, the inclusion body 311 The draft angle of the higher side surface 3112 is between 5 and 10.

It is worth to mention that the draft angle of the higher side surface 3112 of the lower body 312 is preferably implemented between 5 and 10. In particular, the draft angle of the outer side surface of the container body 311 (ie, the outer side surface of the main body 31) is also implemented to be between 5 and 10, which facilitates the successful completion of the drafting operation after molding.

Figure 20:
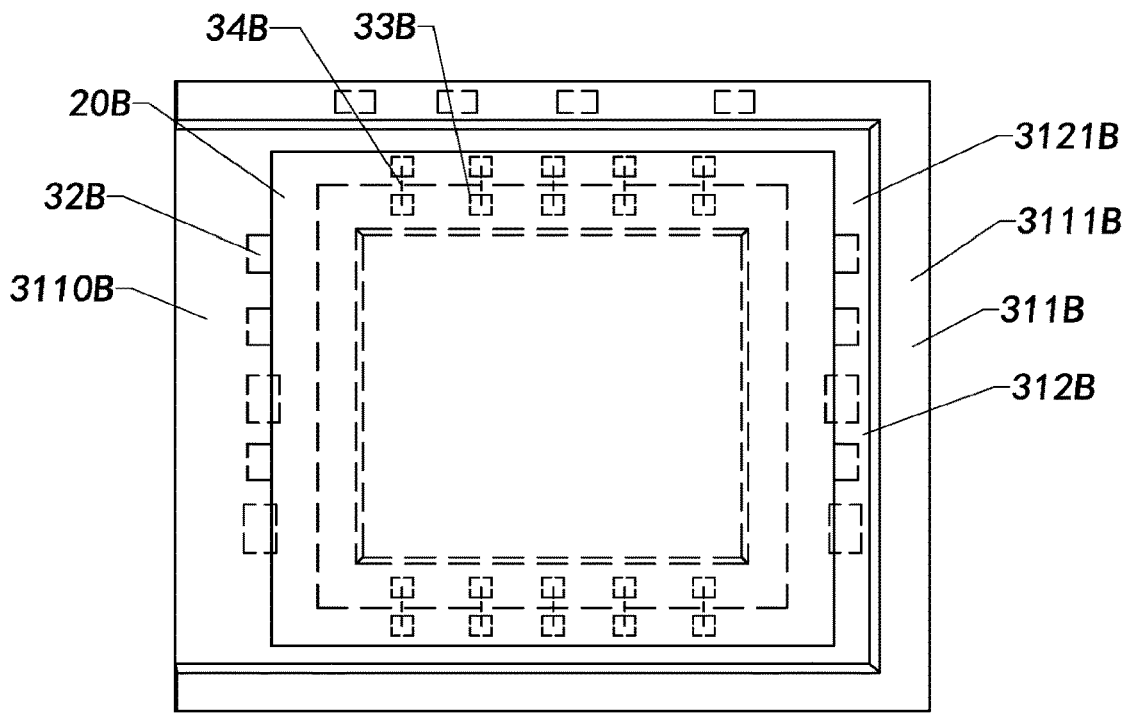
FIG. 20 is a top view of the filter and the molded photosensitive assembly of the camera module according to the above alternative mode of above preferred embodiment of the present invention.

The step IV, as shown in FIG. 20, further comprises the steps of:

IV.1. applying the filter glue 220 in a C-shape on the lower top surface 3121, so that a gap between two ends of the filter glue 220 is formed;

IV.2. mounting the filter 20 on the filter glue 220;

IV.3. solidifying the C-shape filter glue 220; and

IV.4. filling the filter glue 220 into the gap of the C-shape to form the filter glue 220 in an approximate square shape.

Furthermore, as shown in FIG. 20, in step IV.3, the extra air between the filter 20 and the photosensitive chip 33 is discharged through the gap to ensure the pressure between the optical assembly 10 and the photosensitive chip 33 equal to Atmospheric pressure. Preferably, the distance E of the gap is between 0.7 and 1.0 mm (greater than or equal to 0.7 mm and less than or equal to 1.0 mm) to remain a certain gap after the filter 20 attached and pressing on the filter glue 220 to form an escape hole, so that the extra air is discharged from the hole.

It is worth to mention that the upper mould 41 is shaped similar as the supporting cavity 300, so that after demolding the upper mould 41, the supporting cavity 300 is formed between the main body 31 and the photosensitive chip 33.

Figure 9:
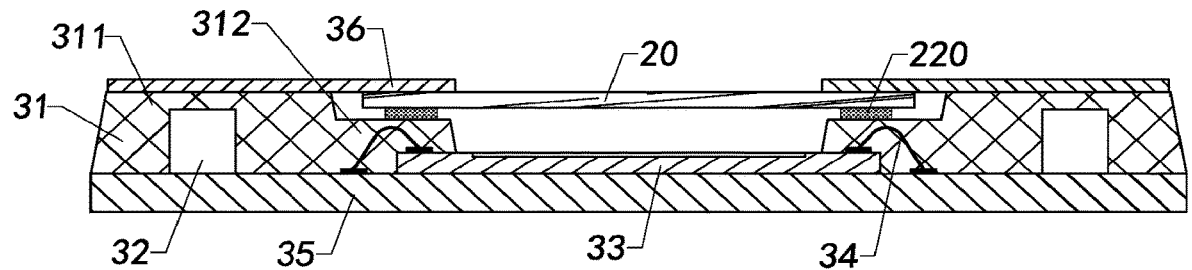
FIG. 9 is a sectional view of the filter and the molded photosensitive assembly of the camera module according to an alternative mode of the above preferred embodiment of the present invention.

An alternative mode of the embodiment is illustrated as in FIG. 9, wherein the molded photosensitive assembly 30 further comprises a top cover 36. The top cover 36 is mounted on the higher top surface 3111 of the container body 311, and extended to cover the peripheral portion 22 of the filter 20, so that the filter 20 is hold from bottom to top to enhance the stability of the filter 20. It is worth to mention that the thickness of the top cover 36 is less than the thickness of the filter 20 to reduce the thickness of the whole camera module.

Figure 10:
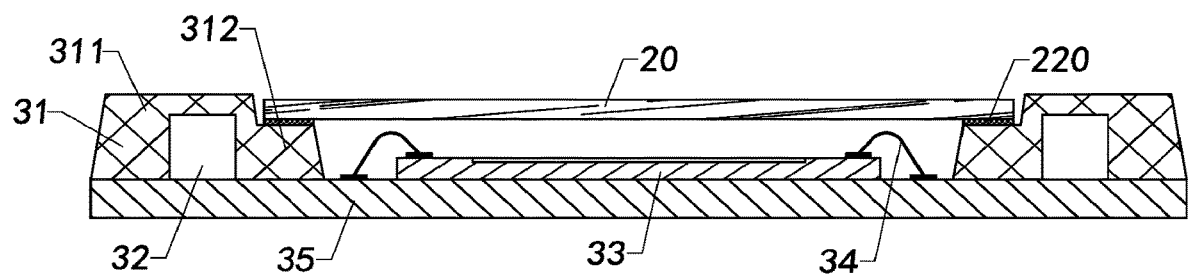
FIG. 10 is a sectional view of the filter and the molded photosensitive assembly of the camera module according to an alternative mode of the above preferred embodiment of the present invention.

The other alternative mode of the embodiment is illustrated as in FIG. 10, which is different from the first embodiment that the lower body 312 is not covering the wires 34 of the molded photosensitive assembly 30. And the thickness of the camera module in this mode is lower than the first embodiment. Because only the lower body 312 is required to be higher than the wires 34 rather than fully covering the wires 34, so the lower body 312 is lower. With lower the lower body 312, the container body 311 can be lower to fit the thickness of the filter 20.

Figure 11:
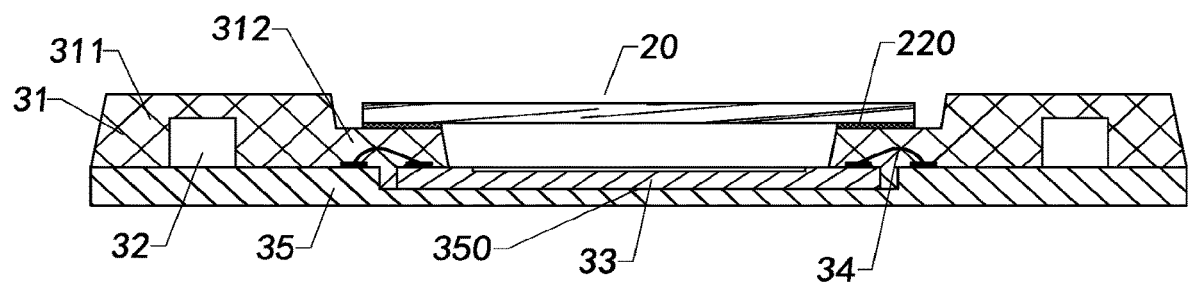
FIG. 11 is a sectional view of the filter and the molded photosensitive assembly of the camera module according to an alternative mode of the above preferred embodiment of the present invention.
Figure 12:
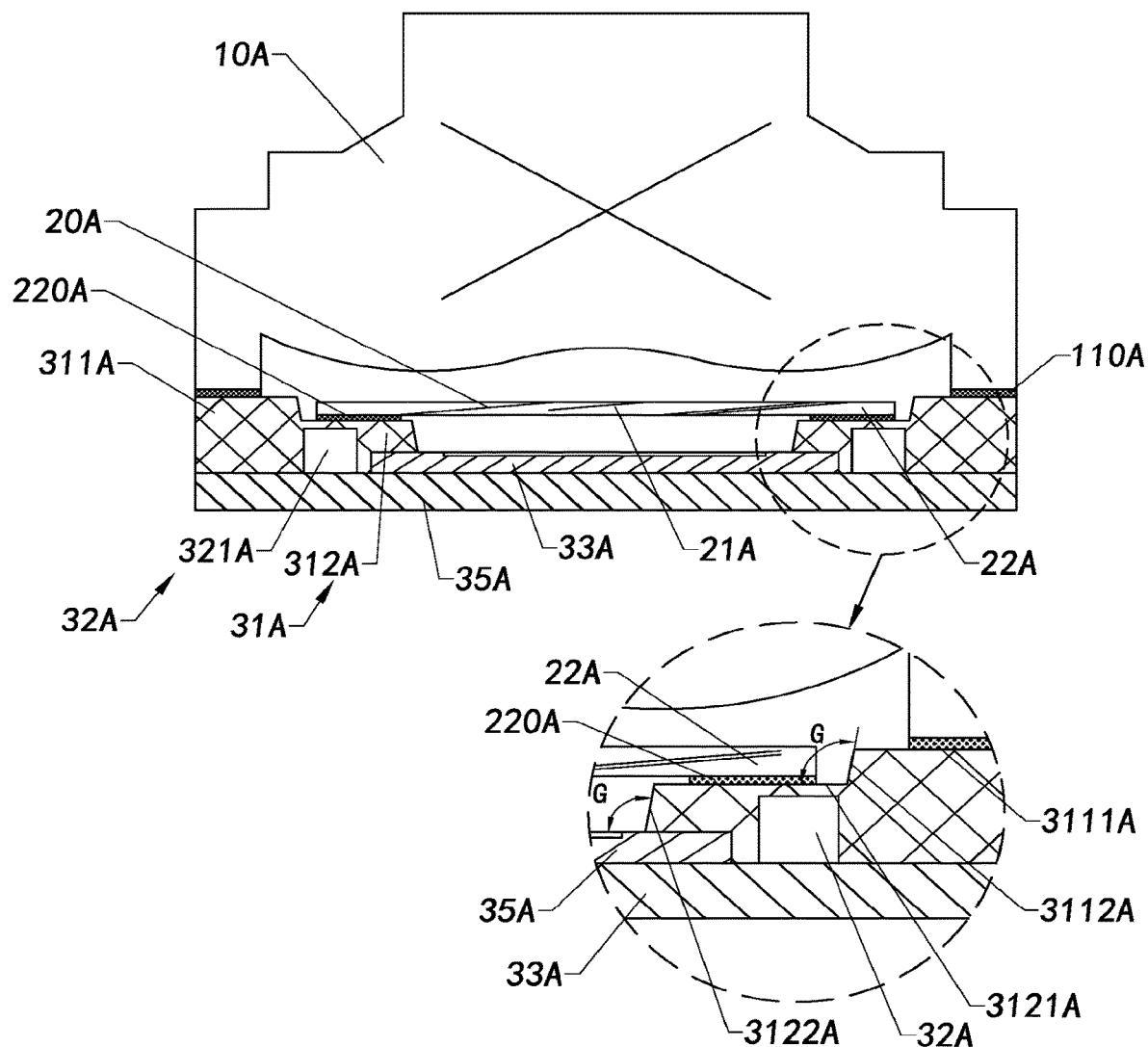
FIG. 12 is a sectional view of a camera module according to a second preferred embodiment of the present invention.
Figure 13:
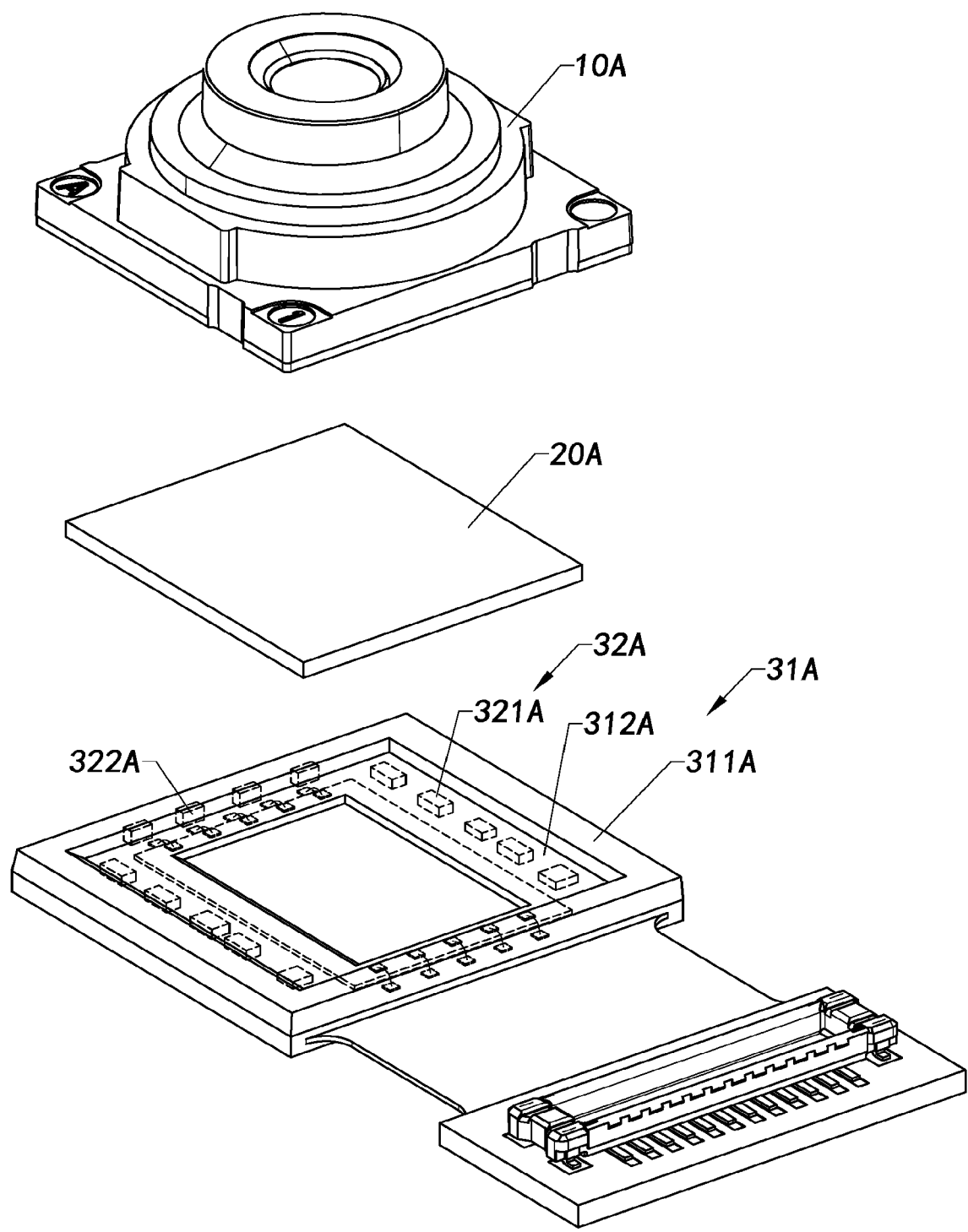
FIG. 13 is a perspective view of the camera module according to the above preferred embodiment of the present invention.
Figure 14:
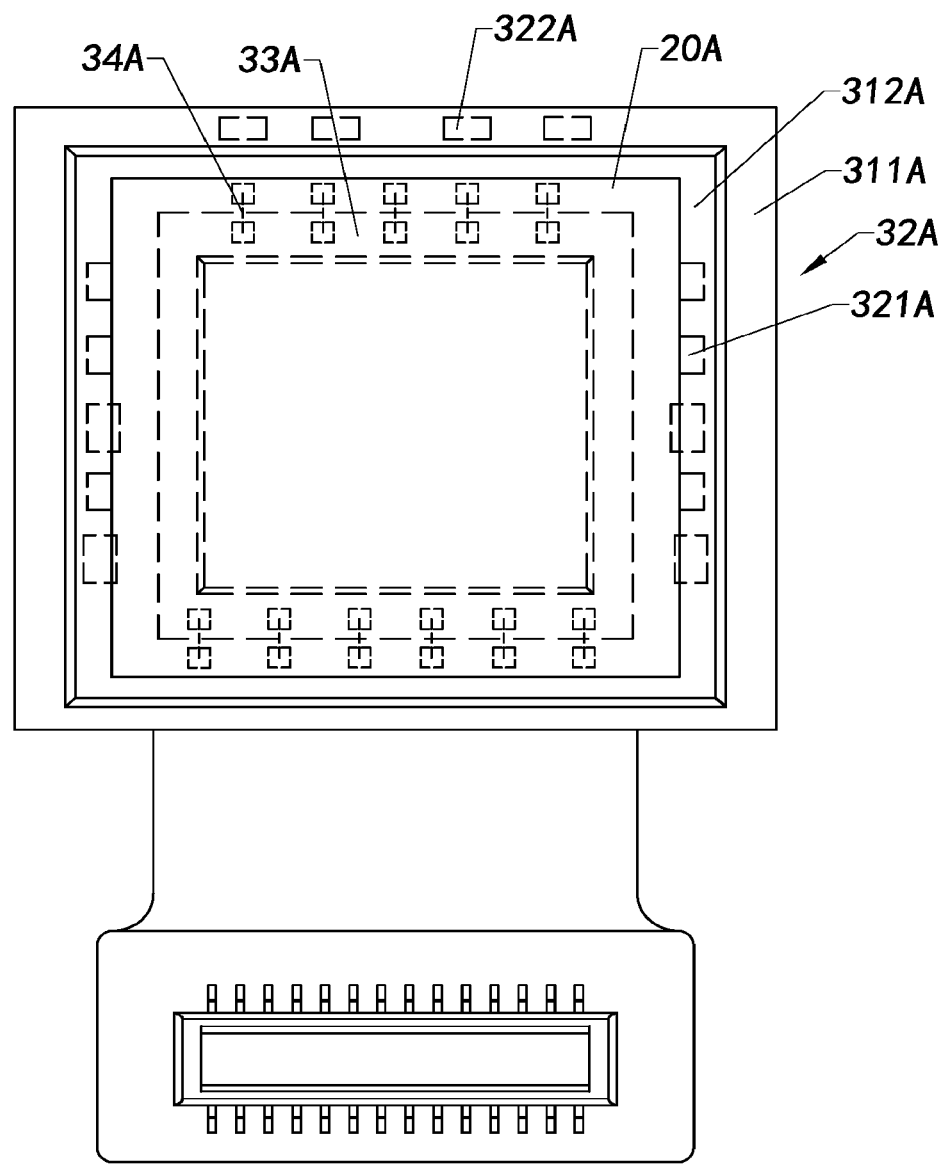
FIG. 14 is a top view of the filter and the molded photosensitive assembly of the camera module according to the above preferred embodiment of the present invention.

The other alternative mode of the embodiment is illustrated as in FIG. 11, which is different from the first embodiment that the photosensitive chip 33 is mounted lower than where the electronic components 32 mounted on the circuit board 35. For example, the connecting surface 350 of the circuit board 35 is further shaped with a recess in the center, so that the photosensitive chip 33 is mounted in the recess of the circuit board 35. And the thickness of the camera module in this mode is lower than the first embodiment since the lower body 312 is only required to be higher than the wires 34 rather than fully embedding the wires 34, and the wires 34 is lower because of the sunken photosensitive chip 33.

It is worth to mention that second embodiment of the present invention is illustrated in FIGS. 12-15, which is different from the first embodiment that the electronic components 32A, the wires 34A and the photosensitive chip 33A are embedded mainly by the lower body 312A. In other words, the lower body 312A is higher than at least part of the electronic components 32A to fully embed the electronic components 32A inside at least part of the main body 31A.

In this embodiment, the filter 20 A is mounted on top of the lower body 312A and the optical assembly 10A is mounted on top of the container body 311A. With the electronic components 32A mainly embedded by the lower body 312A, the electronic components 32A are only stressed under the filter 20A without bearing the weight and movement of the optical assembly 10A, so that the electronic components 32A can have longer service time. It can be understood that, in this embodiment of the invention, the filter 20A is firmly bonded to the lower top surface 3121A of the lower body 312A by the filter glue 220A; the optical assembly 10A passes the lens glue 110A is firmly bonded to the higher top surface 3111A of the container body 311A to ensure the relative positions of the filter 20A and the optical assembly 10A and the photosensitive chip 33A respectively remain unchanged.

It is worth to mention that the height of the different electronic components 32A in the camera module of the present invention may be different, and in order to ensure that the height of the lower body 312A is not too large, the electronic components 32A embedded in the lower body 312A is preferably less than 0.3 mm in height. In other words, in the present invention, an electronic component having a height of less than 0.3 mm is referred to as a low component 321A in the electronic component 32A, and an electronic component having a height of 0.3 mm or more is referred to as a high component 322A in the electronic component 32A. The low component 321A in the electronic components 32A is embedded by the lower body 312A, and the high component 322A in the electronic components 32A is embedded by the container body 311A. It will be appreciated that the low component 321A in the electronic components 32A of the present invention may all be embedded by the lower body 312A (i.e., in the top view direction, all of the low components 321A are disposed on the lower body 312A). Alternatively, the low component 321A in the electronic component 32A may be partially embedded by the lower body 312A (ie, a part of the low component 321A is disposed within the lower body 312A in a top view direction).

More preferably, the periphery of the photosensitive chip 33A is provided with the wires 34A or the electronic component 32A (ie, the low component 321A) embedded in the short body 312A, and the wires 34A and the low components 321A are respectively located on different sides of the photosensitive chip 33A. That is, the wires 34A and the electronic component 32A embedded in the short body 312A are not disposed in order from the inside to the outside surrounding the photosensitive chip 33A. In other words, the low component 321A in the electronic component 32A may be distributed according to the position of the wires 34A, and not all of the sides of the photosensitive chip 33A have the wires 34A, so the low component 321A in the electronic component 32A may preferably be placed on the photosensitive chip 33A one side or both sides without the wires 34A, so that the area of the wiring board can be reduced, the area of the molding in the XY direction can be reduced, and the area of the camera module can be reduced. It should be understood that since the width of the low component 321A in the electronic component 32A is usually about 0.25 mm, which is similar to the thickness of the lower body 312A, if the low component 321A in the electronic component 32A is desired to be integrated into the short body 312A, and the low component 321A in the electronic component 32A can only be disposed on the side of the photosensitive chip 33A where the wires are not provided. That is, the low component 321A in the electronic component 32A is not compatible with the arrangement position of the wires 34A, so that the portion of the short body 312A where the low component 321A is disposed cannot be wiring golded (i.e., the wires 34A cannot be provided).

It is worth to mention that the high component 322A of the electronic component 32A is preferably disposed on the side of the photosensitive chip 33A having the wires 34A, so that the side of the container body 311A on the photosensitive chip 33A without the wires 34A is need not cover the electrical component 32A. That is, the container body 311A does not have to be emptied from the electronic component 32A, and therefore, the thickness of the container body 311A can be reduced, and the thickness of the lower body 312A can be slightly increased. Preferably, the thickness of the container body 311A is smaller than the lower body 312A. The lower body 312A provides larger the lower top surface 3121A to supporting the peripheral portion 22A of the filter 20A than the first embodiment. The filter 20A is stably mounted on the lower body 312A.

The angle G between the higher side surface 3112A and the lower top surface 3121A can be equal or greater than 100° in this embodiment. In other words, the container body 311A is inclinedly extended from the top of the lower body 312A, so that the container body 311A is well supported and capable of supporting the optical assembly 10A without effecting the filter 20A. In other words, the angle G is formed while demolding in manufacturing. Also the lower side surface 3122A is inclinedly with the photosensitive chip 33A, which is similar as the angle G, so as to provide supporting force stably.

In this embodiment, the container body 311A is designed to support the optical assembly 10A. The higher top surface 3111A of the container body 311A is asymmetrical on four sides. In other words, four sides of the higher top surface 3111A of the container body 311A are in different thickness, so that the optical assembly 10A is protruded from less thick portion of the container body 311A, which benefits to improve fitness between the camera module and the mounting casing 51 of the smart device. In other words, in order to fit the mounting casing 51 of the smart device, the portion of the container body 311A near the mounting casing 51 is in less thickness, so that the optical assembly 10A is slightly non-aligned with the molded photosensitive assembly 30A. The optical assembly 10 A is biased to the mounting casing 51, for easily improving the fitness between the camera module and the mounting casing 51 of the smart device. As shown in FIG. 6, since the container body 311A has no needs to consider the electronic components 32A, the height of the container body 311A can be reduced, so that the leg 111A has more much lower place to be supported on the higher top surface 3111A meanwhile the thickness of the container body 311A can be further reduced to have nearer the optical assembly 10A with the mounting casing 51A.

A manufacturing method of the camera module in above embodiment comprises steps of:

I. connecting the photosensitive chip 33A with the wires 34A and the electronic components 32A on the circuit board 3A5;

II. placing the connected circuit board 35A between an upper mould and a lower mould; and III. embedding the electronic components 32A on the circuit board 35A by the main body 31A which comprises the container body 311A and the lower body 312A shorter than the container body 312A, and at least part of the electronic components 32A is embedded under the lower body 312A.

Furthermore, the method further comprises steps of:

IV. mounting the filter 20A on the lower top surface 3121A of the lower body 312A; and V. mounting the optical assembly 10A on the higher top surface 3111A of the container body 311A.

In one embodiment, the electronic components 32A comprises at least a low component 321A, wherein at least part of the low component 321A is embedded under the lower top surface 3121A of the lower body 312A, and each of the low component 321A is shorter than 0.3 mm.

In one embodiment, the wires 34A is embedded by the lower body 312A, wherein the wires 34A and the low component 321A are all provided surrounding the photosensitive chip 33A, and the wires 34A and the low component 321A are positioned on different sides of the photosensitive chip 33A.

In one embodiment according to the present invention, the thickness of the container body 311A is smaller than that of the lower body 312A at one side thereof, such that the optical assembly 10A is extended from the one side of the container body 311A and protruded beyond the molded photosensitive assembly 30A.

In one embodiment according to the present invention, the electronic components 32A further comprises one or more higher electronic components 322A, wherein the higher electronic components 322A are encapsulated in the container body 311A and the height of the higher electronic component 322A is greater or equal to 0.3 mm.

In one embodiment according to the present invention, the higher electronic components 322A and the wires 34A are located at the same side of the photosensitive chip 33A.

In one embodiment according to the present invention, the angle formed between the higher inner side of the container body 311A and the lower top surface 3121A of the lower body 312A is greater than or equal to 100°.

Figure 15:
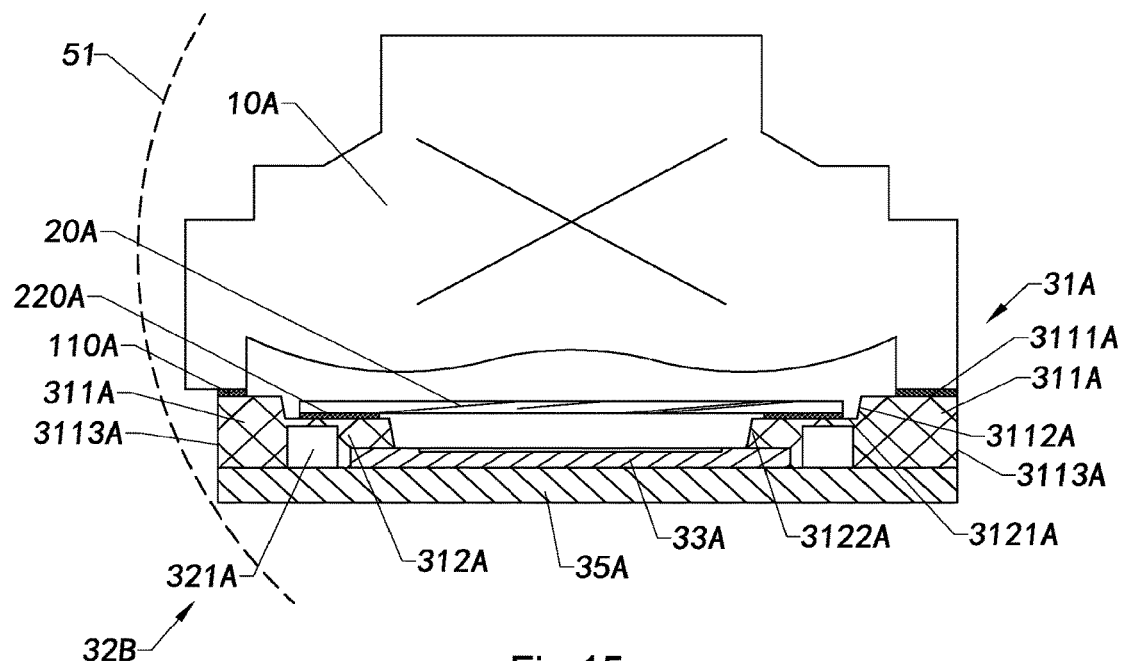
FIG. 15 is a sectional view of the camera module according to the above preferred embodiment of the present invention, illustrating an alternative installing mode in a smart phone.

It is worth mentioning that regarding to the structure of the TOM product, the optical leas 10A of the camera module can be eccentrically provided at the molded photosensitive assembly 30 (30A) for allowing at least one side of the optical assembly 10A outwardly protrudes from the main body 31 (31A) of the molded photosensitive assembly 30 (30A), although the structure of the camera module is designed as the ones illustrated in the FIG. 6 or FIG. 15, in order to improve the engagement between the camera module and the outer casing of the smart device. However, the optical lens of the optical assembly 10A should be optically aligned with the photosensitive chip 33 (33A) of the molded photosensitive assembly molded photosensitive assembly 30A (30). Therefore, the thickness of the container body 311A of the main body 31 (31A) at the corresponding side is decreased. But, the container body 311A with a decreasing thickness cause the lens glue 110A gets thinner and once the lens glue 110A gets too much thinner, the adhesion strength between the optical assembly 10 (10A) and the molded photosensitive assembly 30 (30A) will not be strong enough, while the adhesion material of the lens glue 110 (110A) may pollutes the filter 20 (20A).

In addition, an assembly cavity should be reserved between the higher side surface 3112 (3112A) of the container body 311 (311A) and the filter 20 (20A), such that the adjusting range of the thickness of the container body 311A (311A) gets very smaller. In other words, the thickness of the container body 311A (311A) is hard to decrease, which is not beneficial to improve the engagement between the camera module and the outer casing of the smart device. In order to solve the above problems, as illustrated in the FIGS. 16-21C, a third preferred embodiment according to the present invention is illustrated, wherein different from the first and second preferred embodiment, the container body 311B of the main body 31B of molded photosensitive assembly 30B has a higher top surface 3111B and a lower top surface 3110B and the height of the higher top surface 3111B is greater than that of the lower top surface 3110B. In other words, the distance between the circuit board 35B and the higher top surface 3111B is greater than the distance between the circuit board 35 and the lower top surface 3110B, such that one portion of the optical assembly 10B is supported at the higher top surface 3111B of the container body 311B and the other portion of the optical assembly 10 B supported at the lower top surface 3110B thereof.

In other words, the container body 311B of the molded photosensitive assembly 30B is discontinuous (that is, the top surface of the container body 311B is discontinuous), that comprises the higher top surface 3111B and the lower top surface 3110B lower than the higher top surface 3111B, such that while a portion of the optical assembly 10B is attached to the higher top surface 3111B of the container body 311B via the lens glue 110B, the other portion of the optical assembly 10B is attached to the lower top surface 3110B thereof via the lens glue 110B.

In certain examples according to the present invention, the lens glue 110B of the camera module may comprises an adhesion layer 1101B and a addition adhesion layer 1102B, wherein the adhesion layer 1101B is applied between the optical assembly 10B and the higher top surface 3111B of the container body 311B for affixing the optical assembly 10B to the higher top surface 3111B of the container body 311B via the adhesion layer 1101B. The adhesion layer 1101B is provided between the lower top surface 3110B of the container body 311B and the optical assembly 10B for affixing the optical assembly 10B to the container body 311B more securely.

Preferably, the lens glue 110 is applied at the container body 311 along the higher top surface 3111B thereof to form the adhesion layer 1101B having a same with shape of the higher top surface 3111B of the container body 311B, so as to maximize the bonding strength between the optical assembly 10B and the molded photosensitive assembly 30B. After the lens glue 110B is cured and forms the adhesion layer 1101B, additional lens glue 110B is applied between the lower top surface 3110B of the container body 311B and the optical assembly 10B to form the addition adhesion layer 1102B having a same shape with the lower top surface 3110B of the container body 311B, such that the addition adhesion layer 1102B is not only able to strengthen the bonding between the optical assembly 10B and the container body 311B, but also able to seal the space between the optical assembly 10B and the container body 311B so as to prevent external contaminant polluting the optical assembly 10B and/or the filter 20B.

It is appreciated that, since the lower top surface 3110B of the container body 311B is lower than the higher top surface 3111B thereof, the gap formed between the lower top surface 3110B of the container body 311B and the legs 111B of the optical assembly 10B is larger than the gap formed between the higher top surface 3111B of the container body 311B and the legs 111B of the optical assembly 10B. In other words, the addition adhesion layer 1102B applied between the lower top surface 3110B of the container body 311B and the optical assembly 10B is thicker than that applied between the higher top surface 3111B of the container body 311B and the optical assembly 10B. In this way, the bonding between the optical assembly 10B and the molded photosensitive assembly 30B can be reinforced while the thickness of the container body 311B at the lower top surface 3110B can be decreased for improving the engaging between the camera mould and the outer casing of the smart device.

Figure 17:
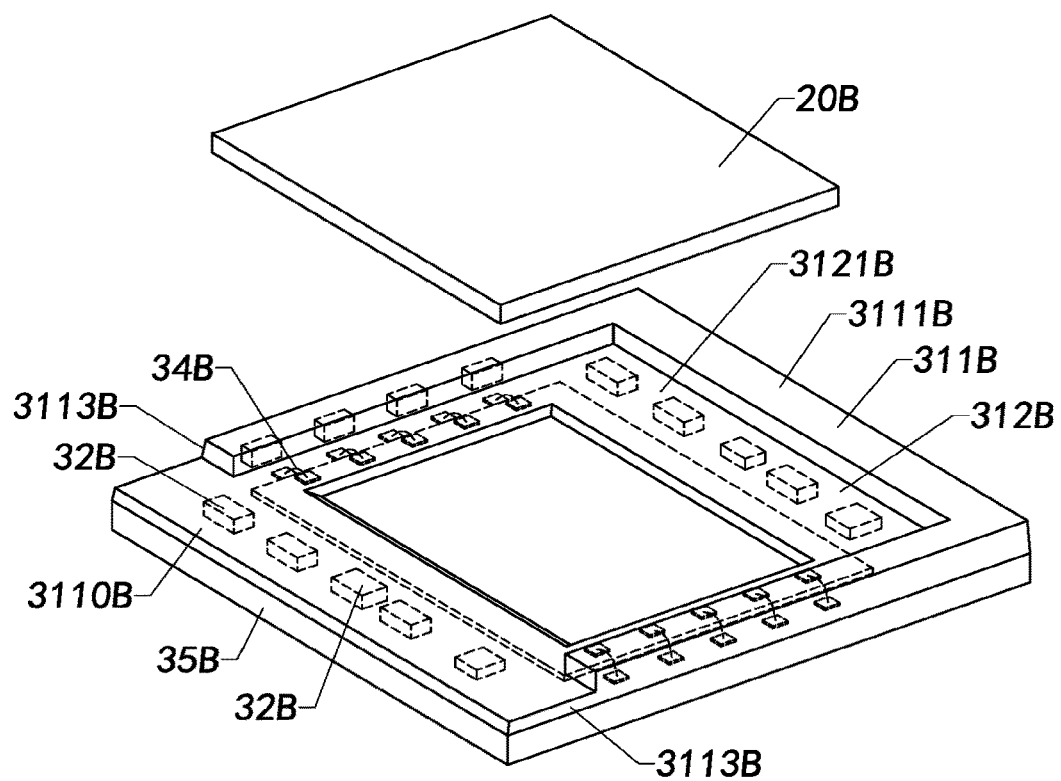
FIG. 17 is an exploded view of the camera module according to the above preferred embodiment of the present invention.

More specifically, as shown in the FIG. 17, the higher top surface 3111B of the container body 311B according to the preferred embodiment of the present invention has a U shape, wherein the lower top surface 3110B of the container body 311B has a linear shape and extends from a higher outer side surface 3113B of container body 311B to other higher outer side surface 3113B thereof (that is, the length of the lower top surface 3110B of the container body 311B is equal to the distance between the two higher outer side surfaces 3113B) so as to form a U-shaped slot in the main body 31B. In other words, the higher top surface 3111B of the container body 311B is corresponding with three side edges of the optical assembly 10B and the lower top surface 3110B of the container body 311B is corresponding to one side edge of the optical assembly 10B, such that three sides of the optical assembly 10B is supported on the higher top surface 3111B of the container body 311B while one side of the optical assembly 10B is supported on the lower top surface 3110B of the container body 311B. It is appreciated that the addition adhesion layer 1102B formed between the lower top surface 3121B of the lower body 312B is thicker than the adhesion layer 1101B formed at the higher top surface 3111B of the container body 311B for maintaining the optical assembly 10B parallel with the filter 20B.

Preferably, the adhesion layer 1101B of the lens glue 110B may have a U-shape matching with the higher top surface 3111B of the container body 311B. The addition adhesion layer 1102B of the lens glue 110B may have a linear shape matching with the lower top surface 3110B of the container body 311B. In this way, the adhesion layer 1101B and the addition adhesion layer 1102B are incorporated with each other to form the lens glue 110 with an open-mouth shape, so as to seal the space between the optical assembly 10B and the molded photosensitive assembly 30B for preventing external contaminant polluting the optical assembly 10B and/or the filter 20B.

It is worth mentioning that in certain examples according to the present invention, the electronic components 321B, because of its larger height, is suitable to be encapsulated in the main body 31B and located below the higher top surface 3111B of the container body 311B. In other words, the electronic components 321B are suitable to arrange at three sides of the photosensitive chip 33B and corresponding to the higher top surface 3111B of the container body 311B.

Further, the lower top surface 3110B of the container body 311B is aligned with the lower top surface 3121B of the lower body 312B. In other words, the container body 311 has a height at the lower top surface 3110B thereof equal to the height of the lower body 312B. In this way, there is no need to reserve an avoiding space for filter 20B at the lower top surface 3110B of the container body 311B and the thickness of the container body 311 at the lower top surface 3110B thereof can be decreased, so that the optical assembly 10B is more outwardly protruded from the lower top surface 3110B of the container body container body 311, for improving the engagement between the camera module and the outer casing of the smart device.

Figure 16:
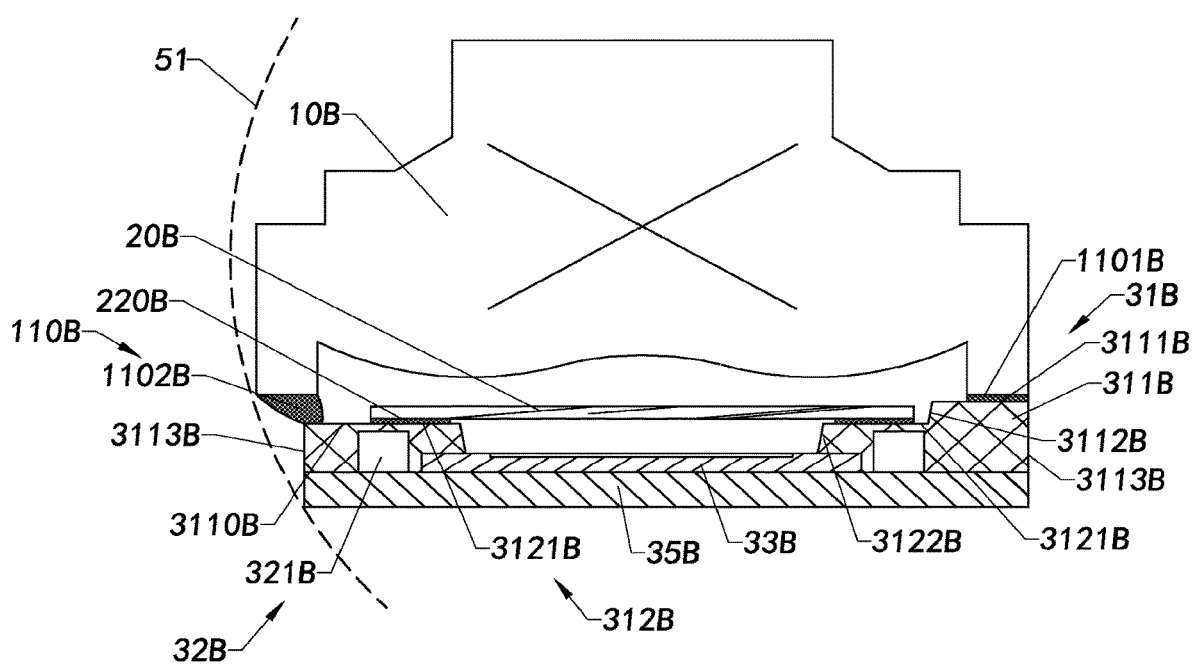
FIG. 16 is a sectional view of a camera module according to a third preferred embodiment of the present invention.

As shown in the FIG. 16, the outer casing 51B of the smart device has rounded corners, and the optical assembly 10 is protruded outwardly from the lower top surface 3110B of the container body 311B, such that the lens glue 110B can be more adjacent to the outer casing 51B so as to increase a screen-to-body ratio of the smart device.

Figure 18:
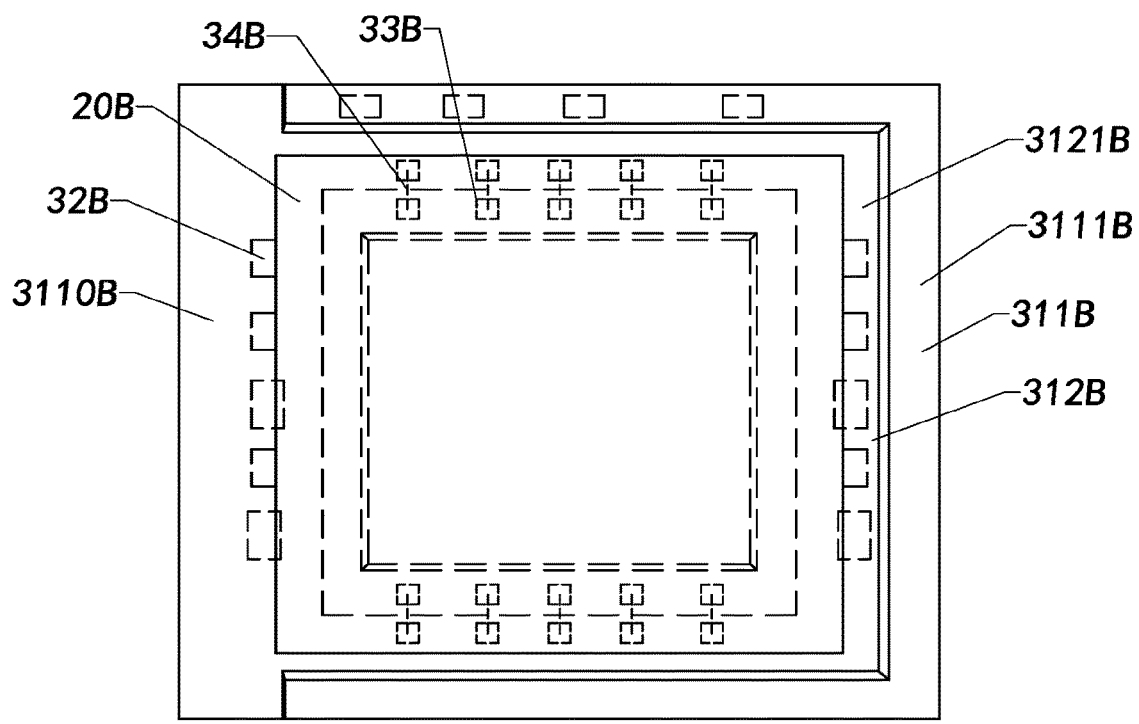
FIG. 18 is a top view of the filter and the molded photosensitive assembly of the camera module according to the above preferred embodiment of the present invention.

As shown in the FIGS. 16-18, the container body 311B has a U-shaped structure and the inner side of the lower body 312B extending to the container body 311B has a square shape to form the U-shaped slot in the main body 31B. In other words, the container body 311 has a notch formed at the lower top surface 3110B of the container body 311B, such that when the optical assembly 10B is attached to the lower top surface 3110B of the container body 311B via the lens glue 110B, a gas-emitting channel is formed between the optical assembly 10B and the lower top surface 3110B of the container body 311B for enabling the gas within the optical assembly 10B and the filter 20B being discharged to the external along the gas-emitting channel when the lens glue 110 is cured, so as to prevent the optical assembly 10B and the filter 20B being damaged by the air expansion therebetween. It is appreciated that similar to the first and second embodiments, the filter 20B is also supported on the lower top surface 3121B of the lower body 312B.

Figure 19:
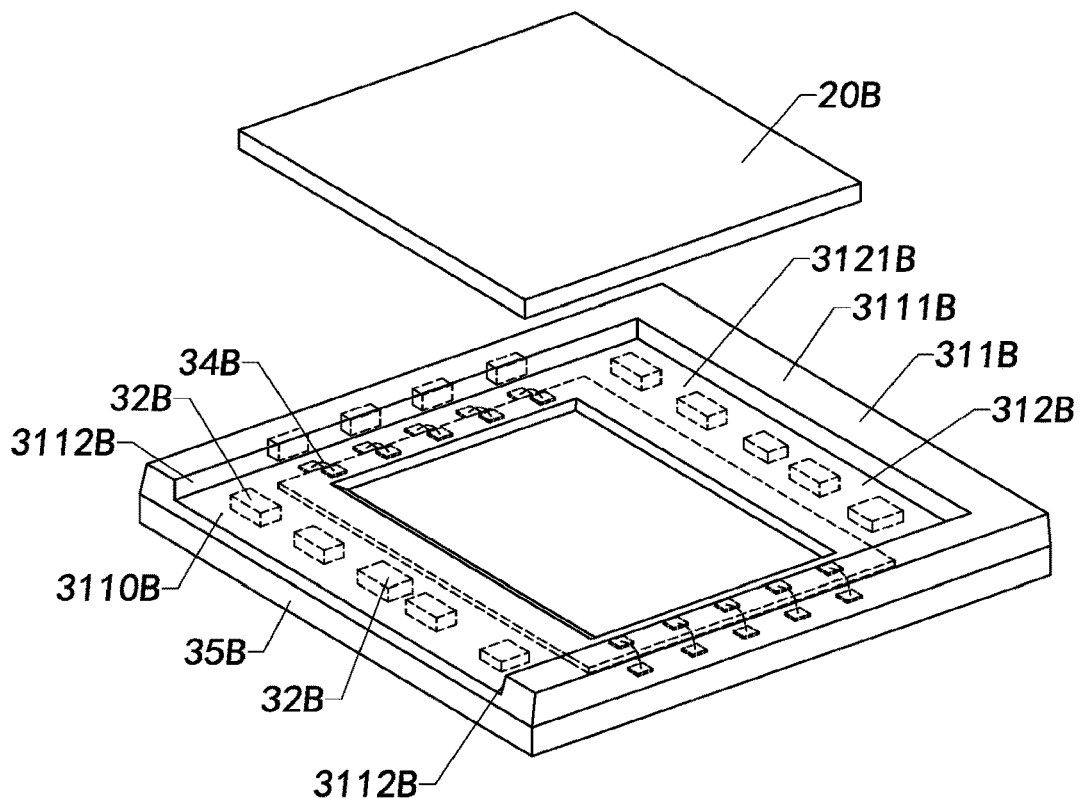
FIG. 19 is a perspective view of the camera module according to an alternative mode of the above preferred embodiment of the present invention.

Referring to FIG. 19 of the drawings, the container body 311B is embodied in another shape. More specially, the lower top surface 3110B of the container body 311B is extended from an higher side surface 3112B to the other higher side surface 3112B thereof (that is, the length of the lower top surface 3110B of the container body 311B is equal to the distance between the two higher side surfaces 3112B), such that the container body 311B has a higher top surface 3111B in layer size for supporting the optical assembly 10B more stably thereon.

Figure 21A:
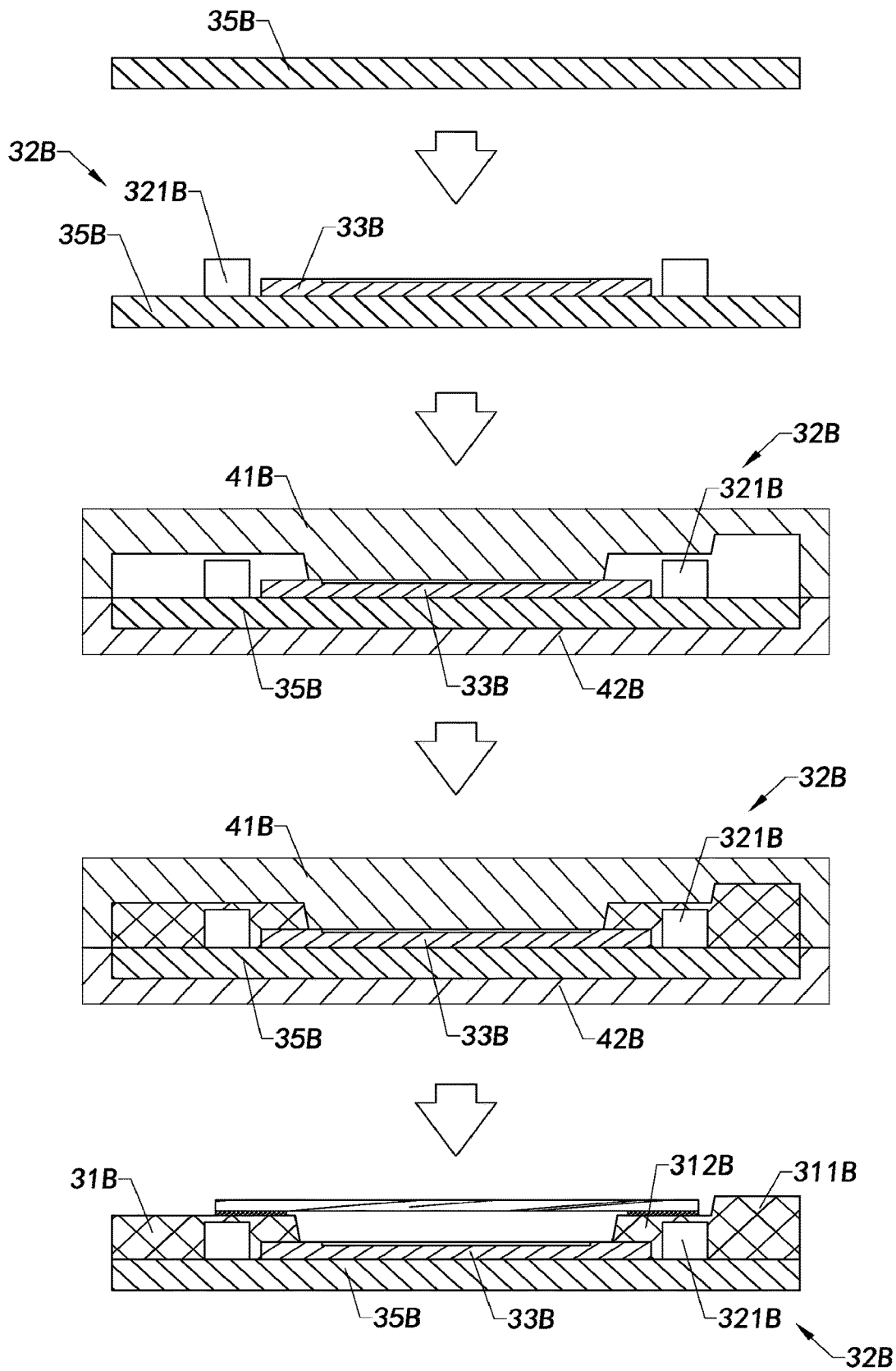
FIGS. 21A, 21B and 21C are flow diagrams of a manufacturing method of the camera module according to the above preferred embodiment of the present invention.
Figure 21B:
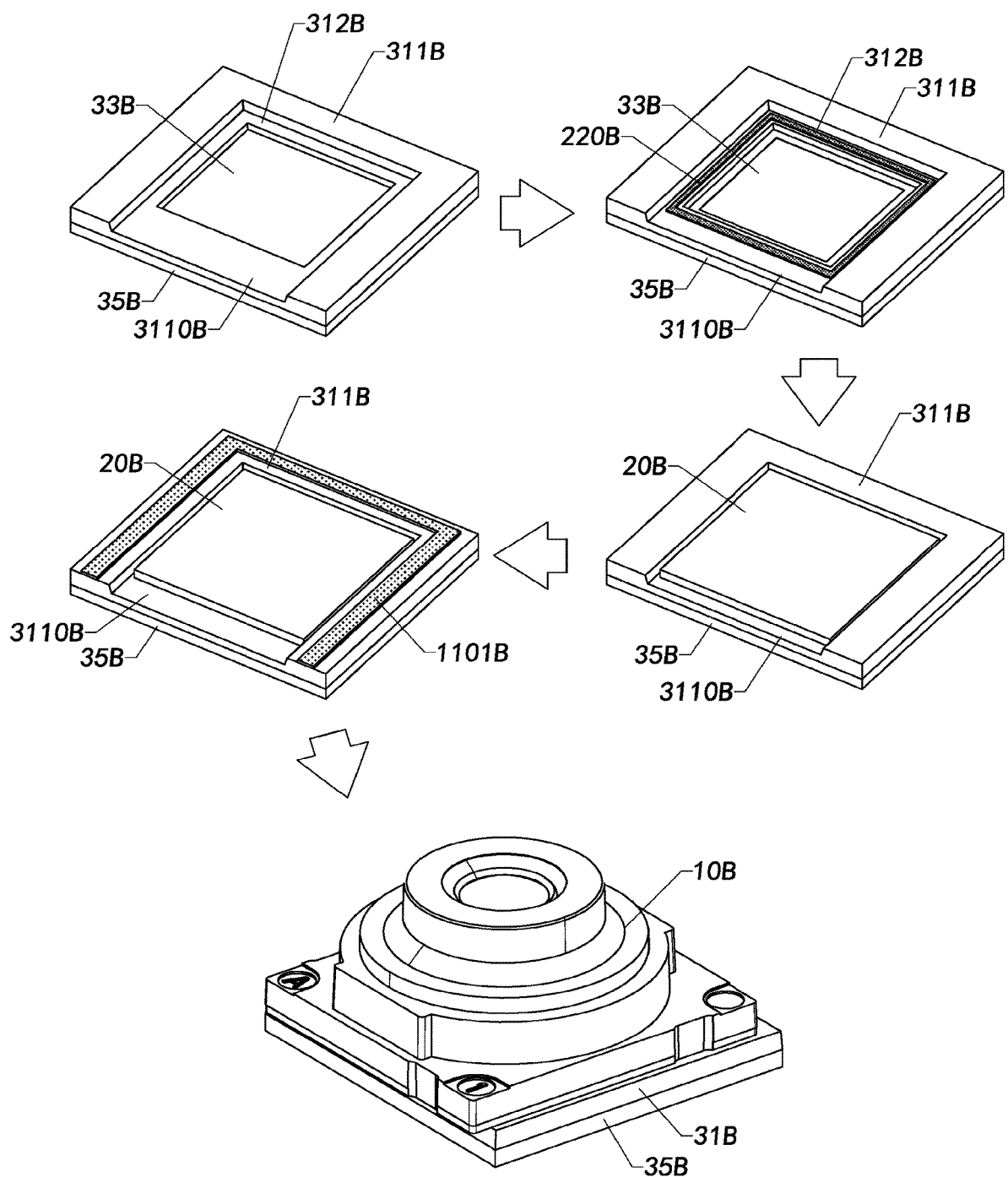
Figure 21C:
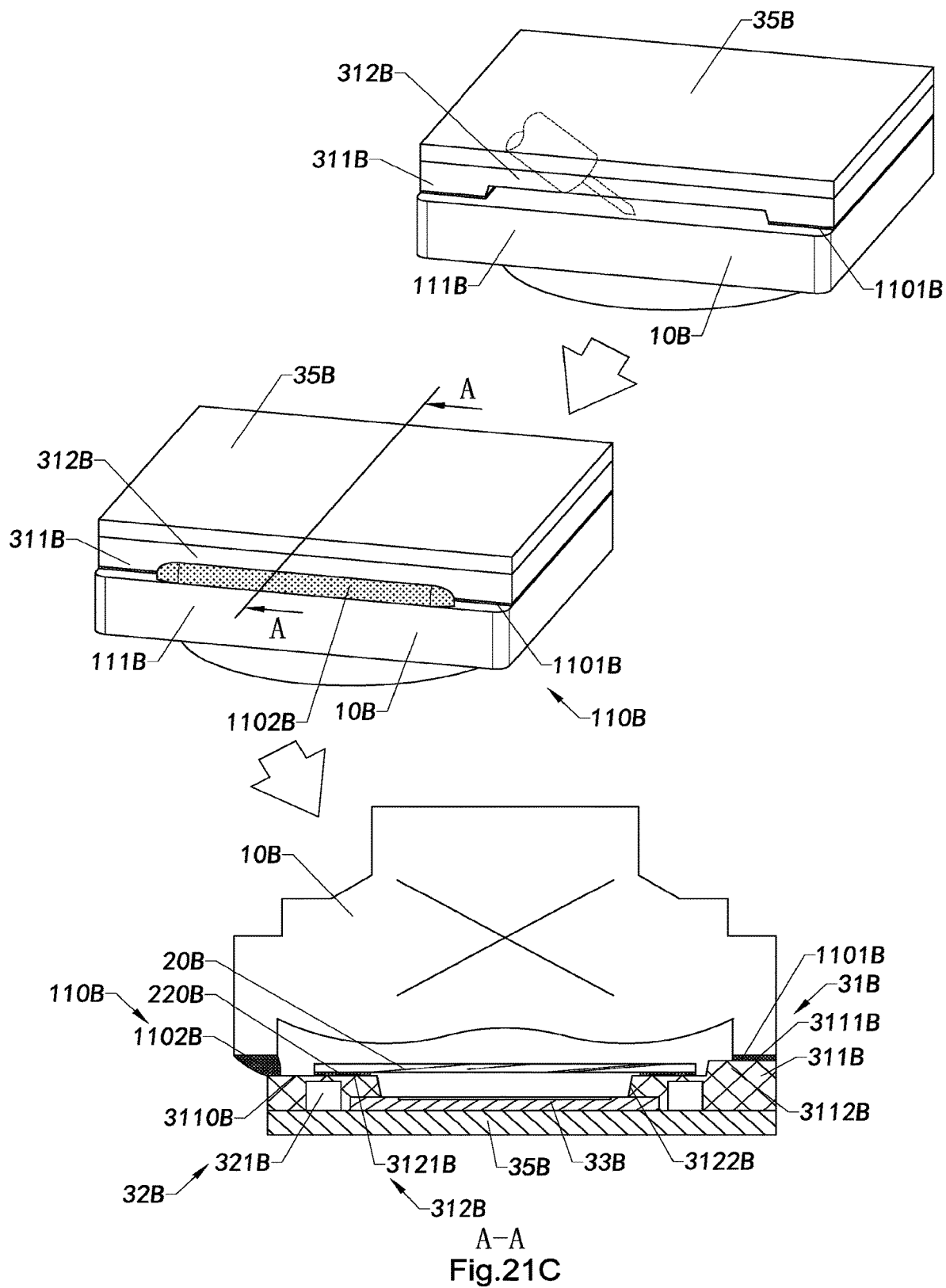

The manufacturing method of the camera module is illustrated in FIGS. 20-21C. The method comprises steps of:

I. connecting the photosensitive chip 33B with the wires 34B and the electronic components 32B on the circuit board 35B;

II. placing the connected circuit board 35B between an upper mould 41B and a lower mould 42B;

III. embedding the electronic components 32B on the circuit board 35B in the main body 31B which comprises the container body 311B and the lower body 312B to form the molded photosensitive assembly 30B;

IV. mounting the filter 20B on the lower top surface 3121B of the lower body 312B; and V. biased mounting the optical assembly 10B on the higher top surface 3111B of the container body 311, so that the optical assembly 10B is closed to at least one side of a mounting casing 51.

Furthermore, the step V further comprises steps of:

V.1 fixing the optical assembly 10B with the higher top surface 3111B of the container body 311B;

V.2 firming the optical assembly 10B on the lower top surface 3110B of the container body 311B, wherein the lower top surface 3110B is shorter than the higher top surface 3111B.

In one embodiment, the higher top surface 3111B of the container body 311B in step III is U-shaped, so that the optical assembly is supported on the higher top surface 3111B of the container body 311B on three sides, and on lower top surface 3110B of the container body 311B on one side.

In one embodiment, lower top surface 3110B of the container body 311B is extended from one of the higher side surface 3112B of the container body 311B to the other higher side surface 3112B.

It is worth to mention that, in step V.1, applying the lens glue 110B on the higher top surface 3111B of the container body 311B, to form a adhesion layer 1101B between the higher top surface 3111B of the container body 311 B and the optical assembly 10B.

Furthermore, the step V.2 further comprises steps of:

V.21 placing the optical assembly 10B and the molded photosensitive assembly 30B upside down to position the optical assembly 10B under the molded photosensitive assembly 30B; and V.22 applying the lens glue 110B between the leg 111B of the optical assembly 10 B and the lower top surface 3110 B of the container body 311B, to form an addition adhesion layer 1102B With the optical assembly 10B and the molded photosensitive assembly 30B are upside down, the lens glue 110B has no chance to flow into the in-light surface 211B of the filtering portion 21B so that the filter 20B is maintained clear and well supported.

In one embodiment, the adhesion layer is U-shaped, and the addition fixing layer 1102B is straight line shaped.

In one embodiment, the adhesion layer is L-shaped, and the addition fixing layer 1102B is L-shaped.

In particular, in an embodiment of the invention, the angle between the high side surface 3112B of the container body 311B and the lower top surface 3121B of the lower body 312B is between 95° and 100°.

It is worth mentioning that when the higher top surface 3111B of the container body 311B is U-shaped, the lower top surface 3110B of the container body 311B will be linear and located one side of the main body 31B, such that the optical assembly 10B of the camera module can protrude outward from the side where the lower top surface 3110B to outside of the molded photosensitive member 30B, contributing the optical assembly 10B extremely close to the mounting casing of the smart device on the side of the lower top surface 3110B, such that the camera module is adapted to be mounted to a non-corner region of the mounting casing to be unilaterally adjacent to the mounting casing. However, when the camera module is mounted on a corner area of the mounting casing of the smart device, the optical assembly 10B cannot be on both sides at the same time close to the mounting casing because the optical assembly 10B is only on one side of the lower top surface 3110B of the main body 31B, resulting in insufficient fitness between the camera module and the mounting casing.

Figure 22:
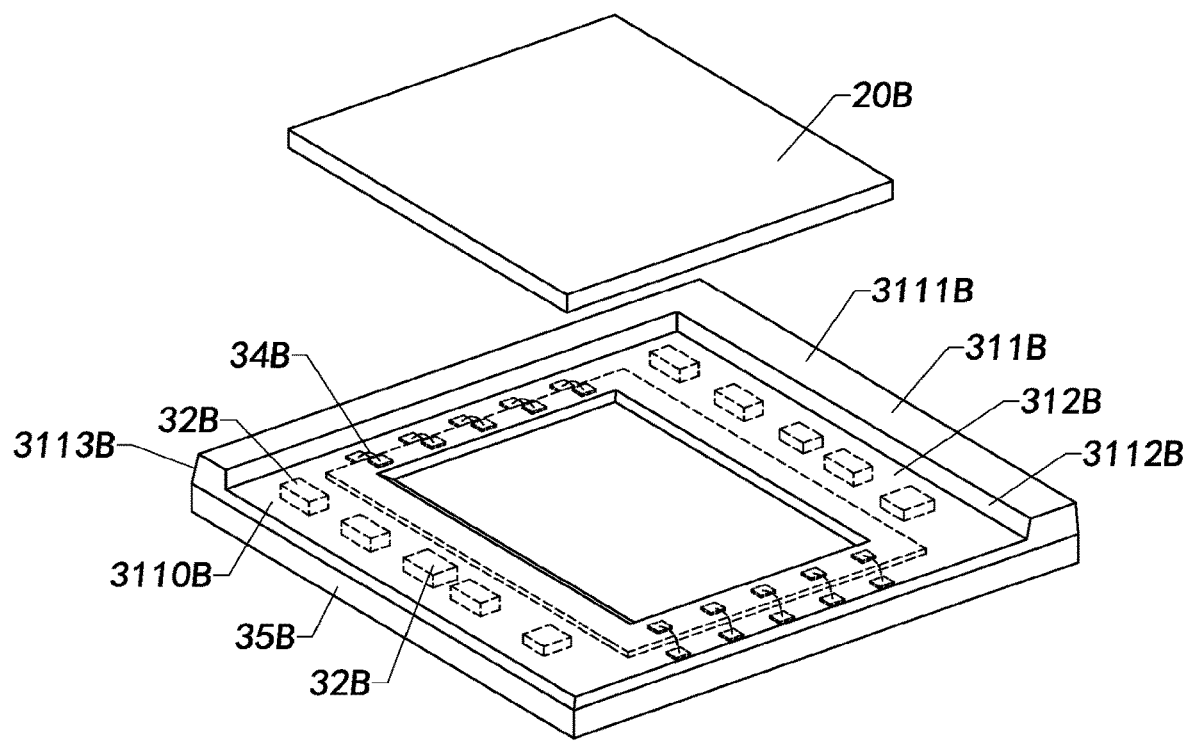
FIG. 22 and FIG. 23 are schematic views illustrating the other alternative mode of the above preferred embodiment of the present invention.
Figure 23:
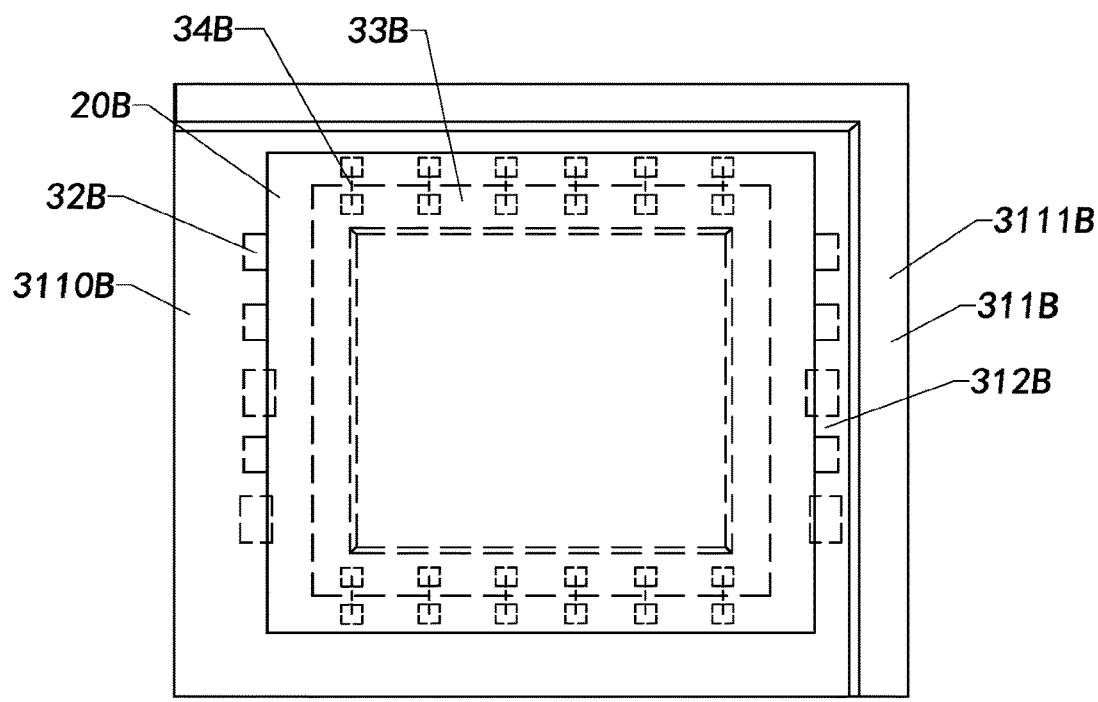

Therefore, in order to solve the above problems, the present invention further provides another alternative embodiment of the camera module, as shown in FIG. 22 and FIG. 23, wherein the higher top surface 3111B of the container body 311B is L-shaped, and the lower top surface 3110B of the container body 311B is also L-shaped such that the lower top surface 3110B is located on two adjacent sides of the main body 31B. In other words, in the alternative embodiment of the present invention, the higher top surface 3111B of the container body 311B of the molded photosensitive member 30B of the camera module is L-shaped, such that the optical assembly 10B is supported on the adjacent two sides of higher top surface 3111B of the container body 311B, and on two adjacent sides of the lower top surface 3110B of the container body 311B. Thus, the optical assembly 10B of the camera module can protrude from the two sides of the lower top surface 3110B on the molded photosensitive member 30B, which benefits the optical assembly 10B extreme proximity to the mounting casing of the smart device on the two sides of the lower top surface 3110B, such that the camera module is adapted to be mounted to a corner region of the mounting casing, such that the optical assembly 10B is bilaterally adjacent to the mounting casing maximizes the screen radio of the smart device.

Preferably, the adhesion layer 1101B of the lens glue 110B may be L-shaped to match the higher top surface 3111 B of the container body 311B. The addition adhesion layer 1102B of the lens glue 110B may also be L-shaped to match the lower top surface 3112B of the container body 312B. The adhesion layer 1101B and the addition adhesion layer 1102 B are combined to form the lens glue 110B having a square-shaped structure to seal a space between the optical assembly 10B and the molded photosensitive member 30B to prevent external dust from entering and contaminating the optical assembly 10B and/or the filter 20B.

It is worth to mention that, in some embodiments of the present invention, the electronic components 321B are adapted to be embedded by the container body 311B of the main body 31B due to a large height, and is located under the higher top surface 3111B of the container body 311B. In other words, the electronic components 321B are adapted to be disposed on both sides of the photosensitive chip 33B, and the electronic components 321 B are corresponded to the upper top surface 3111B of the container body 311B.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, characterized by comprising:
an optical lens;
a filter chip; and
a molded photosensitive assembly including a main body, a photosensitive chip, and a circuit board electrically connected with the photosensitive chip, wherein the main body is integrally molded on the circuit board, and includes a container body at at least one side of the photosensitive chip and a lower body at more sides than the at least one side of the photosensitive chip and extended integrally from an inner side of the container body at the at least one side, and there is a certain height difference between the container body and the lower body, and the filter chip is provided on the lower body, and a part of the optical lens is provided on the container body;
wires connected with the circuit board and provided at at least one side of the photosensitive chip and embedded by the lower body;
a plurality of electronic components including at least one low component, wherein at least a part of the low component is embedded by the lower body, and the wires and the low component are at different side of the photosensitive chip respectively.

2. The camera module according to claim 1, wherein the container body has a higher top surface, and the lower body has a lower top surface, and the higher top surface of the container body is higher than the lower top surface of the lower body.

3. The camera module according to claim 1, wherein a height of the lower component is less than 0.3 mm.

4. The camera module according to claim 1, wherein the plurality of electronic components includes at least one high component of which a height is larger than or equal to 0.3 mm, and the high component is embedded by the container body.

5. The camera module according to claim 3, wherein the low component of the plurality of electronic components is provided at one or two side of the photosensitive chip without the wires.

6. The camera module according to claim 5, wherein the high component of the plurality of electronic components is provided at one side of the photosensitive chip with the wires.

7. The camera module according to claim 1, wherein the filter chip comprises a filtering portion for transmitting imaging light to the photosensitive chip and a peripheral portion supported on the lower body of the molded photosensitive assembly.

8. The camera module according to claim 1, wherein the filter chip is adhered on the molded photosensitive assembly between the optical lens and the photosensitive chip to be supported in a triangle manner.

9. The camera module according to claim 8, wherein the molded photosensitive assembly further has a supporting cavity formed between the photosensitive chip, the lower body and the container body, wherein the supporting cavity is shaped as an inverted pyramid.

10. The camera module according to claim 7, wherein the filtering portion has an in-light surface and an out-light surface, wherein the in-light surface is facing to the optical lens and the out-light surface is facing to the photosensitive chip.

11. The camera module according to claim 10, wherein the peripheral portion has a peripheral top surface, a peripheral side surface and a peripheral bottom surface, wherein the peripheral top surface is a same surface with the in-light surface and the peripheral bottom surface is a same surface with the out light surface.

12. The camera module according to claim 11, wherein the higher body has a higher top surface supporting the optical lens thereon and a higher side surface inwardly to form a supporting cavity, wherein the lower body has a lower top surface supporting the filter chip thereon and a lower side surface to form the supporting cavity inwardly, wherein the higher side surface and the lower top surface are shaped to define a groove to receive the filter chip therein.

13. The camera module according to claim 12, wherein a distance between the peripheral side surface and the higher side surface is equal to or greater than 0.15 mm.

14. The camera module according to claim 12, wherein a height between the higher top surface and the lower top surface is greater than 0.1 mm.

15. The camera module according to claim 12, wherein a length of the lower top surface, from the higher side surface to the lower side surface, is equal to or greater than 0.4 mm.

16. The camera module according to claim 1, wherein the higher body and the lower body are shaped as an approximated square with rounded corners which an inradius of an inscribed circle of the corners is equal to or greater than 0.3 mm.

17. The camera module according to claim 12, wherein a width between the peripheral bottom surface and the lower top surface of the lower body has a maximum which equals to a width of the peripheral portion which is equal to or greater than 0.25 mm.

18. The camera module according to claim 12, wherein a height of the higher body is equal to or greater than 0.5 mm.

19. The camera module according to claim 12, wherein a distance between the lower top surface of the lower body and the photosensitive chip is equal to or greater than 0.15 mm.

20. A molded photosensitive assembly of a camera module including an optical lens and a filter chip, characterized by comprising:
a main body;
a photosensitive chip; and
a circuit board electrically connected with the photosensitive chip, wherein the main body is integrally molded on the circuit board, and includes a container body at at least one side of the photosensitive chip and a lower body at more sides than the at least one side of the photosensitive chip and extended integrally from an inner side of the container body at the at least one side, and there is a certain height difference between the container body and the lower body, and the filter chip is provided on the lower body, and a part of the optical lens is provided on the container body;
wires connected with the circuit board and provided at at least one side of the photosensitive chip and embedded by the lower body;
a plurality of electronic components including at least one low component, wherein at least a part of the low component is embedded by the lower body, and the wires and the low component are at different side of the photosensitive chip respectively.

* * * * *